(12) United States Patent
Wang et al.

(10) Patent No.: US 12,732,170 B2
(45) Date of Patent: Sep. 8, 2026

(54) FLIP-FLOPS HAVING STRONG TRANSISTORS AND WEAK TRANSISTORS

(71) Applicant: TAIWAN SEMICONDUCTOR MANUFACTURING COMPANY, LTD., Hsinchu (TW)

(72) Inventors: I-Wen Wang, Hsinchu (TW); Po-Chih Cheng, Hsinchu (TW); Jia-Hong Gao, Hsinchu (TW); Kuang-Ching Chang, Hsinchu (TW); Tzu-Ying Lin, Hsinchu (TW); Jerry Chang Jui Kao, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 19/043,946

(22) Filed: Feb. 3, 2025

(65) Prior Publication Data

US 2025/0183878 A1 Jun. 5, 2025

Related U.S. Application Data

(63) Continuation of application No. 18/333,402, filed on Jun. 12, 2023, now Pat. No. 12,218,670.

(51) Int. Cl.
*H03K 3/3562* (2006.01)

(52) U.S. Cl.
CPC ................................ *H03K 3/35625* (2013.01)

(58) Field of Classification Search
CPC ................................................. H03K 3/35625
USPC ......................................................... 327/202
See application file for complete search history.

(56) References Cited

U.S. PATENT DOCUMENTS 6,198,323 B1 * 3/2001 Offord ............... H03K 3/35625 327/202
6,285,227 B1 * 9/2001 Takahashi ........ H03K 3/356156 327/202
8,519,743 B2 * 8/2013 Teh ...................... H03K 19/096 327/202
2007/0273420 A1 * 11/2007 Torvi .................. H03K 3/3562 327/202
2017/0047450 A1 2/2017 Yamazaki et al.

FOREIGN PATENT DOCUMENTS

TW I588839 6/2017
TW I625940 6/2018

* cited by examiner

*Primary Examiner* — Tomi Skibinski
(74) *Attorney, Agent, or Firm* — Hauptman Ham, LLP

(57) ABSTRACT

An integrated circuit includes a first clocked forwarding-switch and a second clocked forwarding-switch each implemented with strong transistors. The integrated circuit also includes a first clocked inverter and a second clocked inverter each implemented with weak transistors. The integrated circuit further includes a first inverter cross coupled with the first clocked inverter and a second inverter cross coupled with the second clocked inverter. An output of the first clocked forwarding-switch is conductively connected with an output of the first clocked inverter, and an output of the second clocked forwarding-switch is conductively connected with an output of the second clocked inverter.

20 Claims, 18 Drawing Sheets

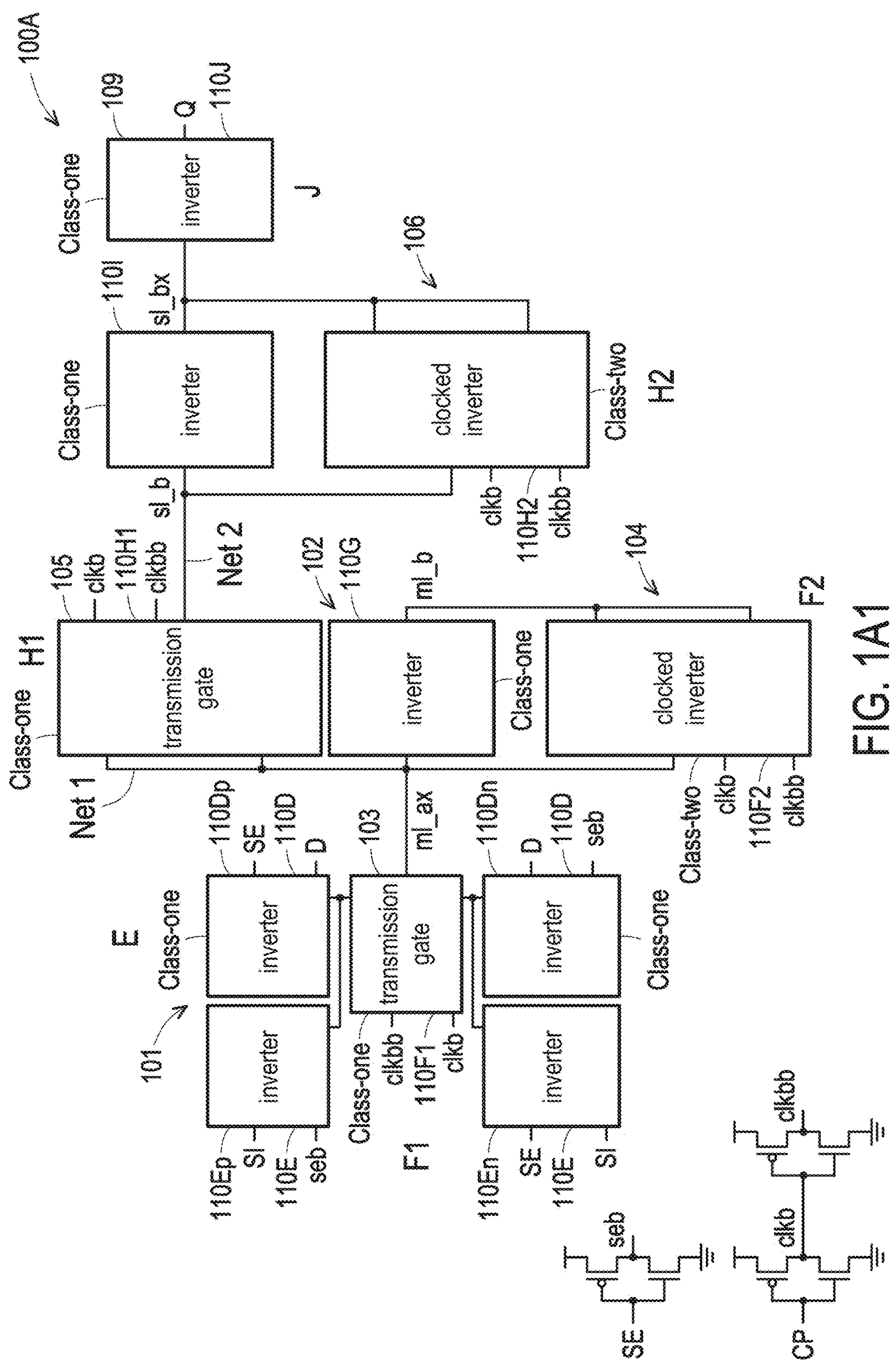
FIG. 1A1

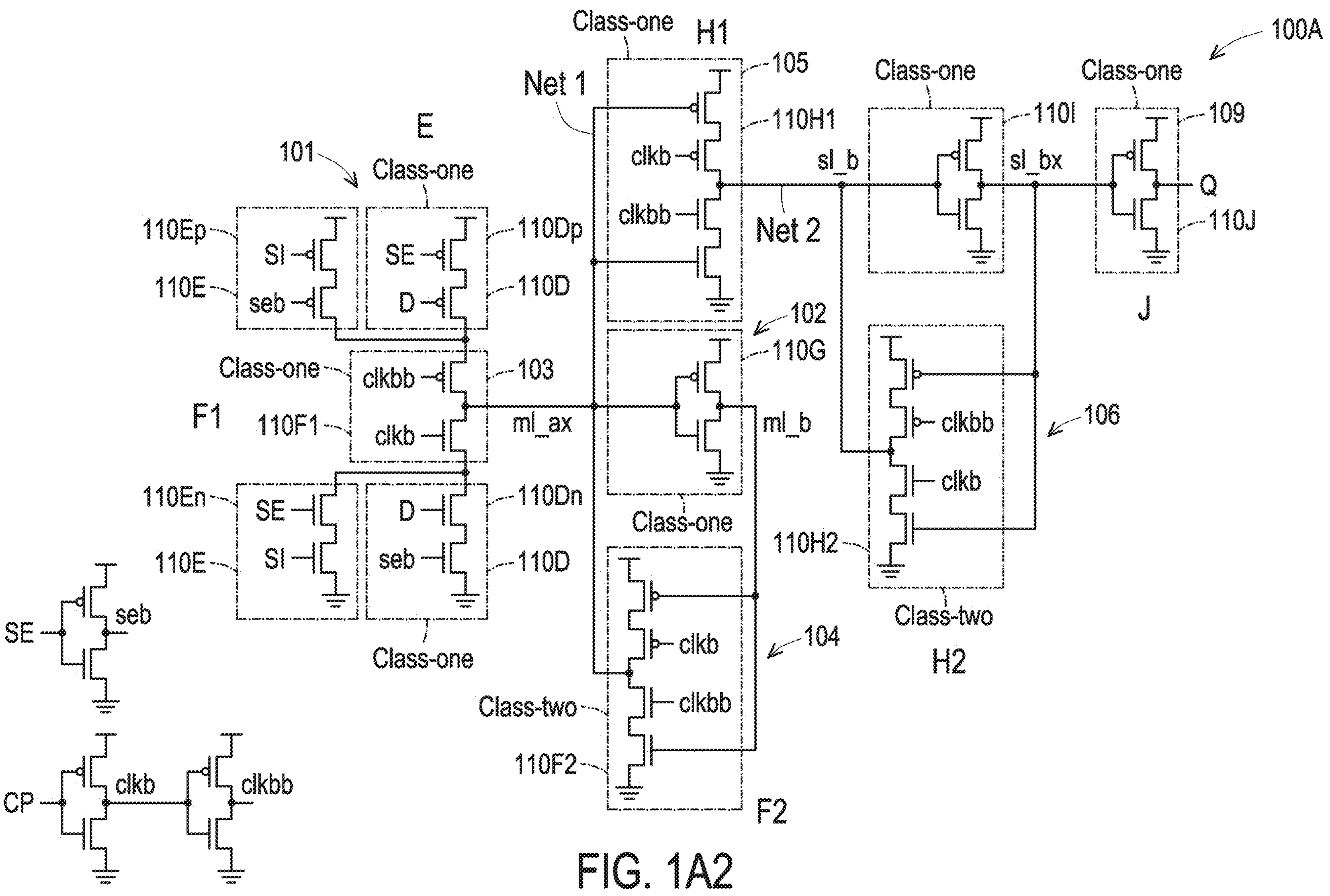
FIG. 1A2

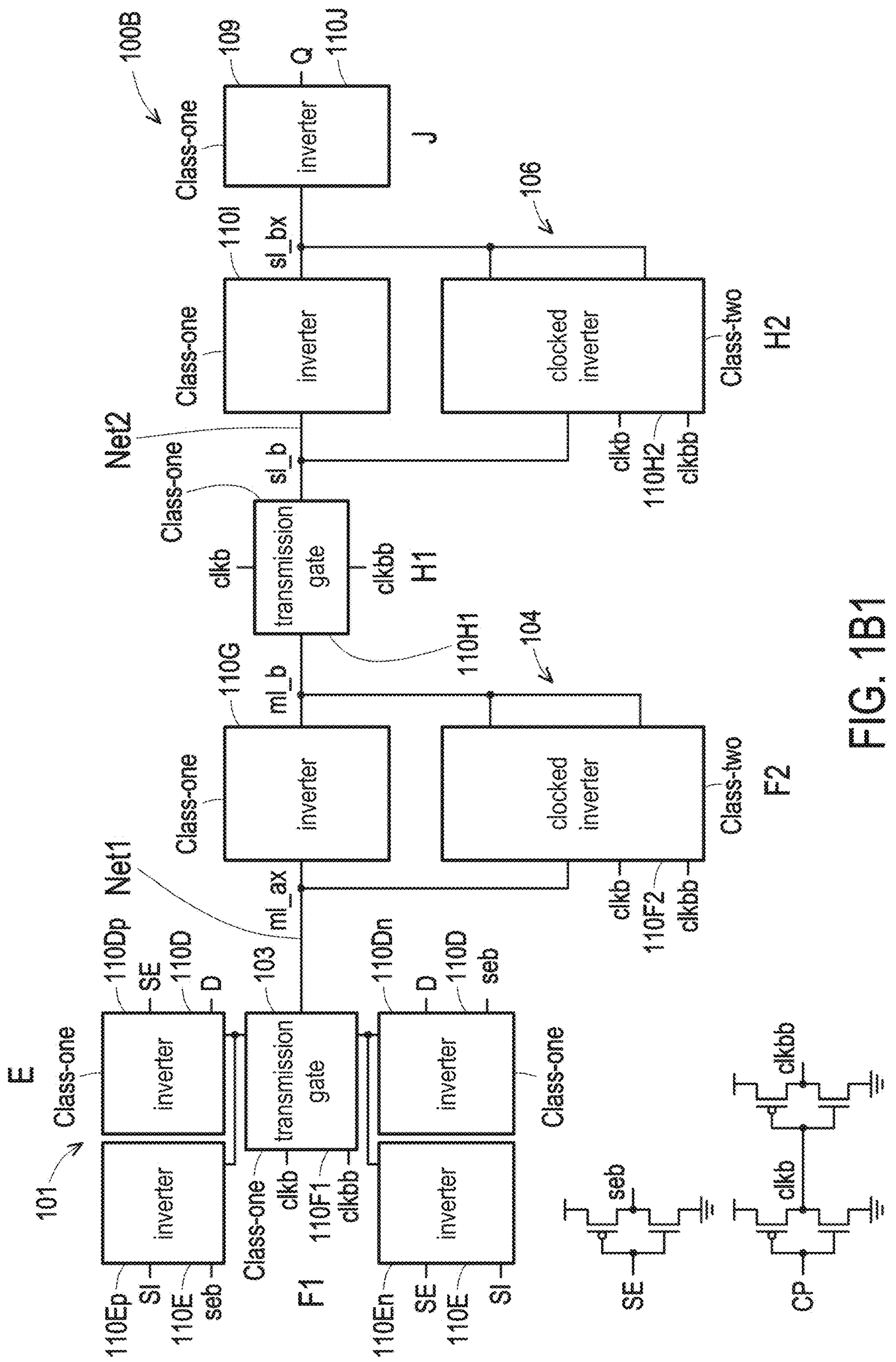
FIG. 1B1

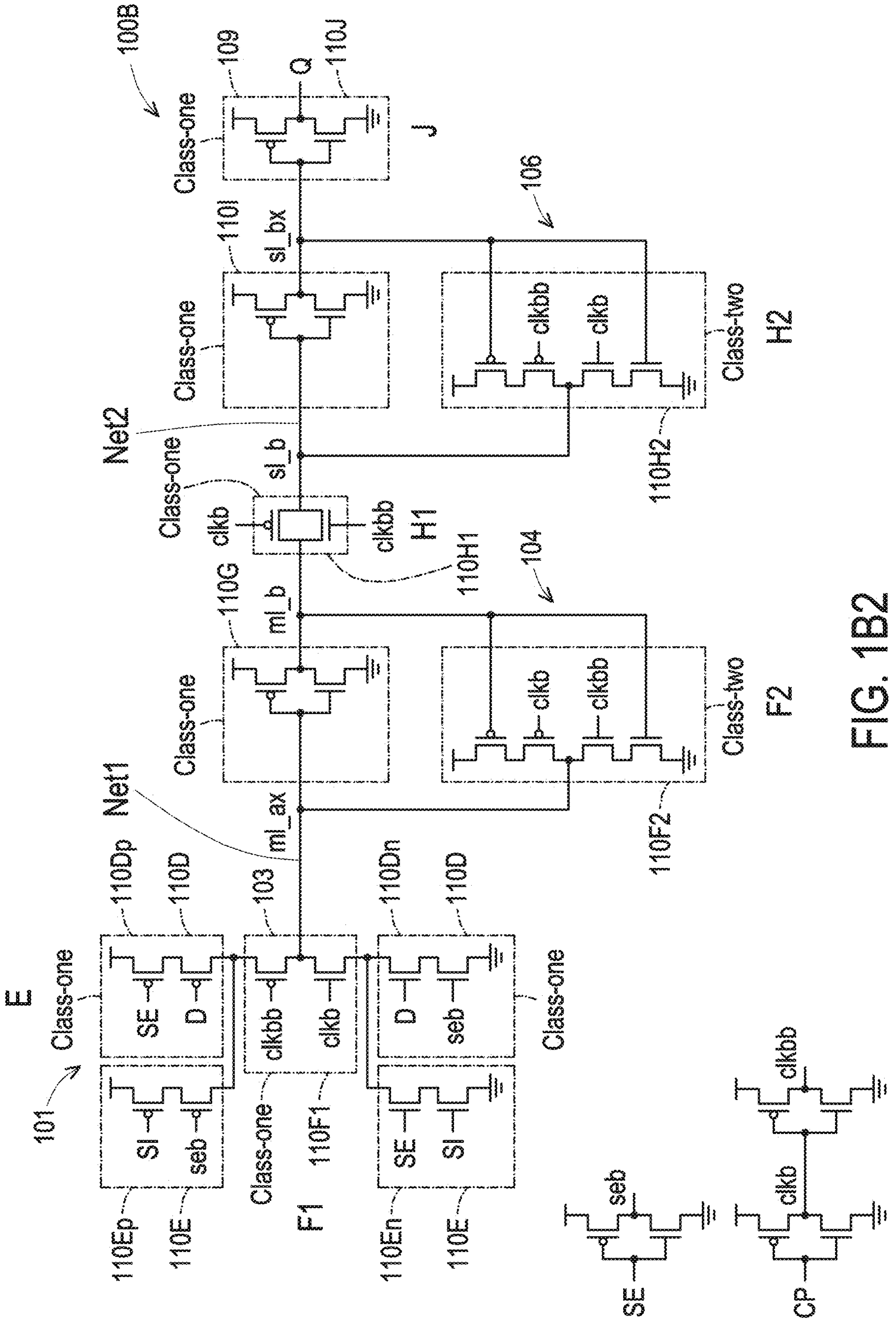
FIG. 1B2

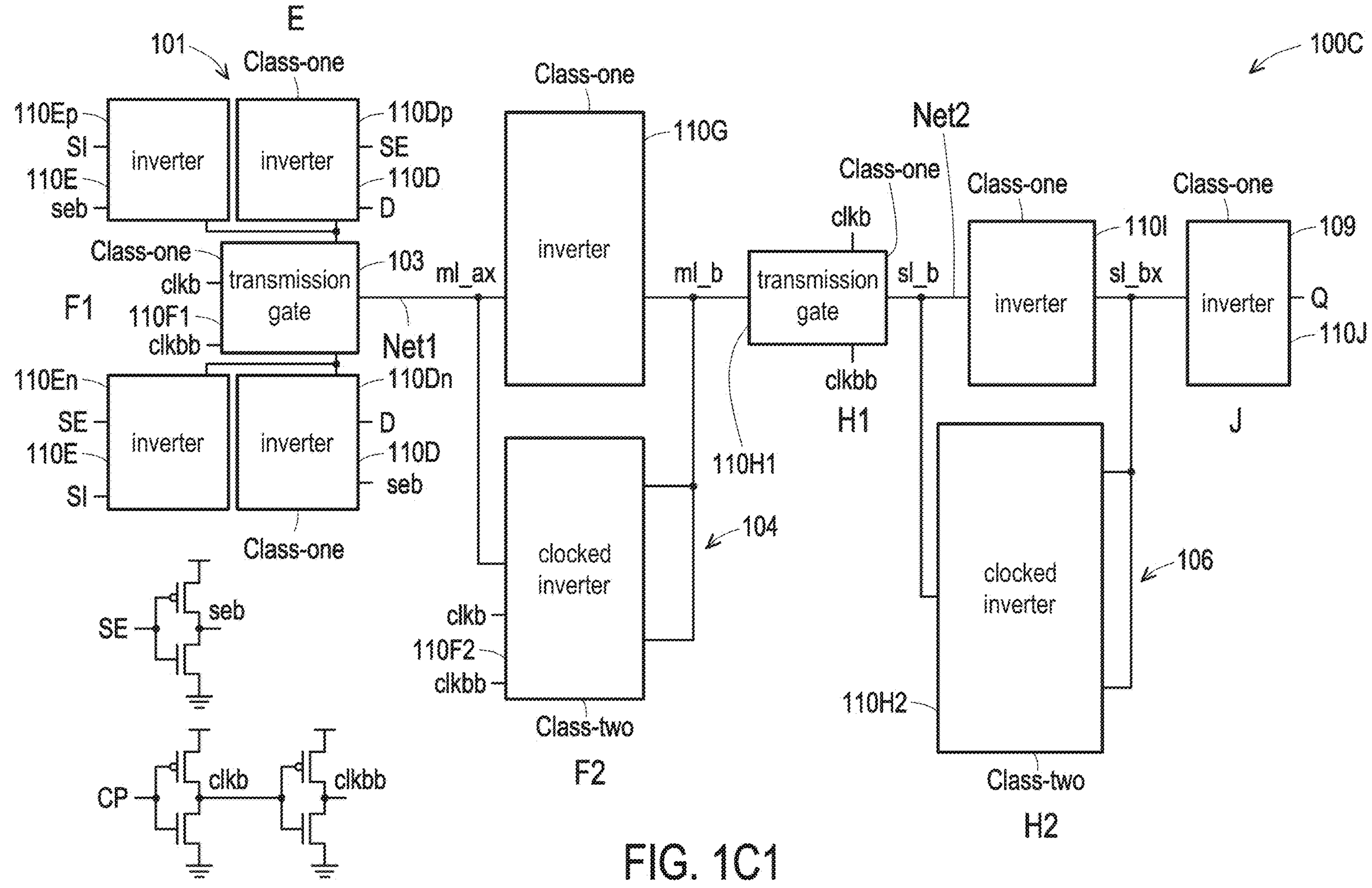
FIG. 1C1

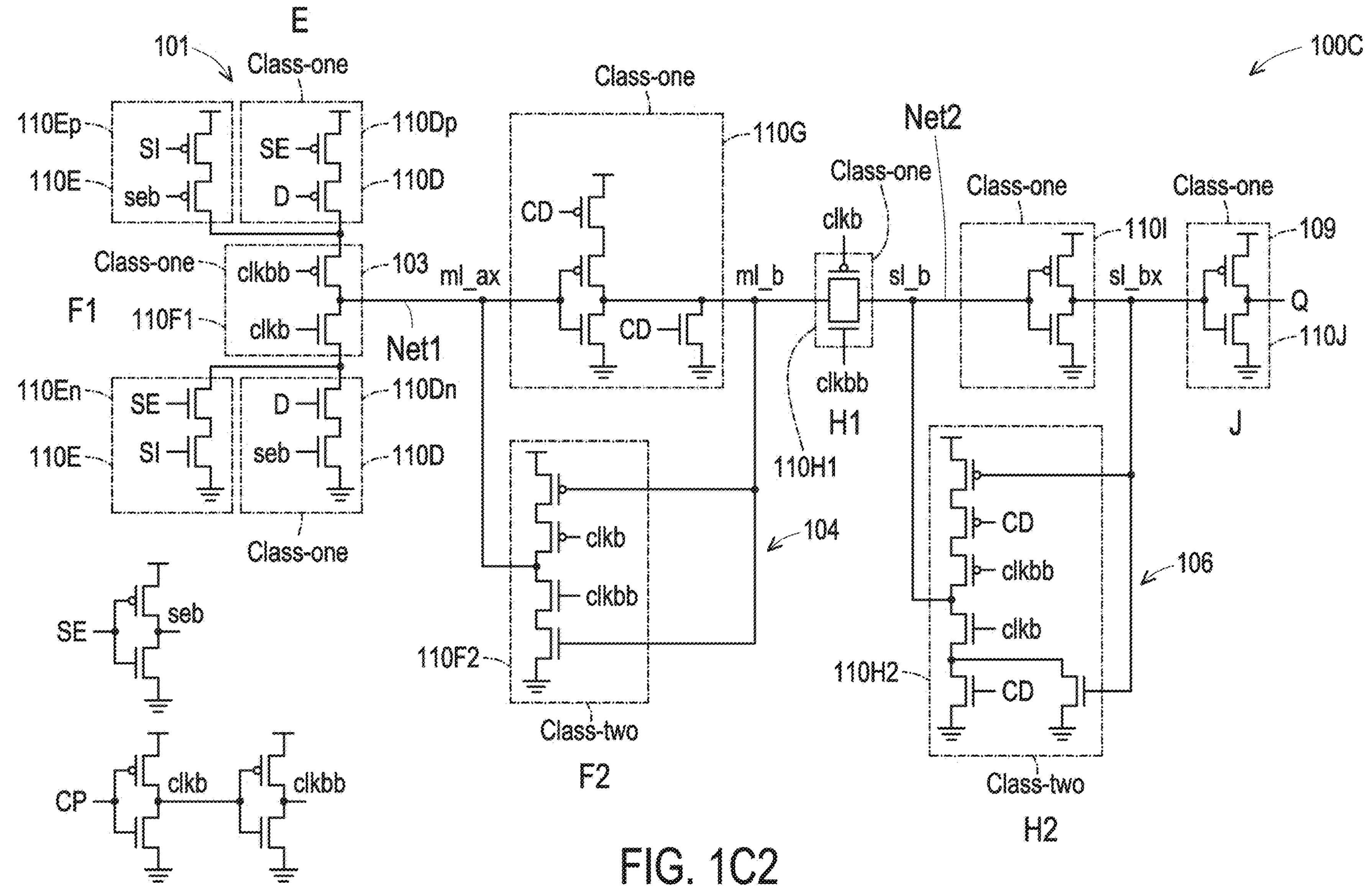
FIG. 1C2

FLIP-FLOPS HAVING STRONG TRANSISTORS AND WEAK TRANSISTORS

PRIORITY CLAIM

The present application is a continuation of U.S. application Ser. No. 18/333,402, filed Jun. 12, 2023, now U.S. Pat. No. 12,218,670, issued Feb. 4, 2025, which relates to U.S. application Ser. No. 18/160,630 filed Jan. 27, 2023, each of which is hereby incorporated by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A1-1C1 are block diagrams of integrated circuits 100A-100C having a master-slave flip-flop and the associated supporting circuits, in accordance with some embodiments.

FIGS. 1A2-1C2 are circuit diagrams of integrated circuits 100A-100C having a master-slave flip-flop and the associated supporting circuits, in accordance with some embodiments.

FIG. 2 is a floor plan of the integrated circuits 100A-100C in FIGS. 1A1-1C1 and FIGS. 1A2-1C2, in accordance with some embodiments.

DETAILED DESCRIPTION

Figure 2:
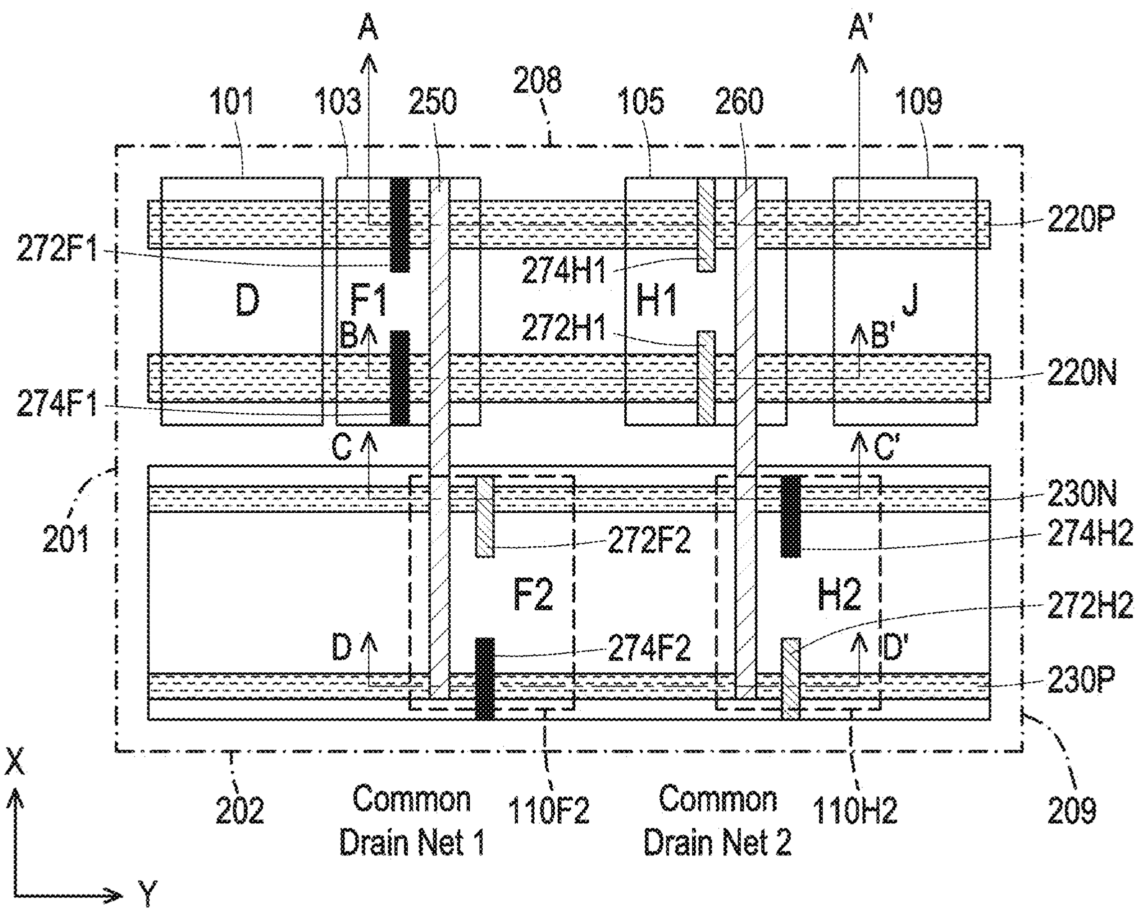

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a master-slave flip-flop includes a first latch having a first inverter cross coupled with a first clocked inverter and a second latch having a second inverter cross coupled with a second clocked inverter. The first clocked inverter and the second clocked inverter are implemented with weak transistors. The master-slave flip-flop also includes a first clocked forwarding-switch and a second clocked forwarding-switch each implemented with strong transistors. The output of the first clocked forwarding-switch is conductively connected with the input of the first inverter. The output of the second clocked forwarding-switch is conductively connected with the input of the second inverter.

In some embodiments, the first clocked forwarding-switch is a transmission gate which is coupled between the output of an input device and the input of the first inverter. In some embodiments, the second clocked forwarding-switch is a transmission gate which is coupled between the output of the first inverter and the input of the second inverter. In some embodiments, the second clocked forwarding-switch is a third clocked inverter which is coupled between the input of the first inverter and the input of the second inverter.

The average gate width of the strong transistors with p-channels is larger than the average gate width of the weak transistors with p-channels. The average gate width of the strong transistors with n-channels is larger than the average gate width of the weak transistors with n-channels. The strong transistors are implemented with strong active-region structures, and the weak transistors are implemented with weak active-region structures. Specifically, the strong PMOS transistors are implemented with strong PMOS active-region structures, and the weak PMOS transistors are implemented with weak PMOS active-region structures. The strong NMOS transistors are implemented with strong NMOS active-region structures, and the weak NMOS transistors are implemented with weak NMOS active-region structures.

In some embodiments, a strong PMOS active-region structure has more fins than a weak PMOS active-region structure, and a strong NMOS active-region structure has more fins than a weak NMOS active-region structure. In some embodiments, a strong PMOS active-region structure has more nano-sheets than a weak PMOS active-region structure, and a strong NMOS active-region structure has more nano-sheets than a weak NMOS active-region structure. In some embodiments, a strong PMOS active-region structure has more nano-wires than a weak PMOS active-region structure, and a strong NMOS active-region structure has more nano-wires than a weak NMOS active-region structure.

The master-slave flip-flops in this disclosure include both strong transistors and weak transistors, thereby the RC delay in the forward signal path of a master-slave flip-flops is reduced while the driving strengths of the first clocked inverter and the second clocked inverter in the backward signal paths are reduced. The master-slave flip-flops in this disclosure have improved switching speeds, as compared with alternative designs in which the transistors with same type of channel (i.e., p-channel or n-channel) have uniform gate widths.

FIGS. 1A1-1C1 are block diagrams of integrated circuits 100A-100C having a master-slave flip-flop and the associated supporting circuits, in accordance with some embodiments. FIGS. 1A2-1C2 are circuit diagrams of integrated circuits 100A-100C having a master-slave flip-flop and the associated supporting circuits, in accordance with some embodiments. The master-slave flip-flop is formed with an input device 101, a first clocked forwarding-switch 103, a master latch 104, a second clocked forwarding-switch 105, a slave latch 106, and an output driver 109. The first clocked forwarding-switch 103 is configured to receive input signals from the input device 101. The master latch 104 is coupled between the first clocked forwarding-switch 103 and the second clocked forwarding-switch 105. The slave latch 106 is coupled between the second clocked forwarding-switch 105 and the output driver 109. The associated supporting circuits include inverters 110A-110C which are configured to generate an inverted clock signal CPB and an in-phase clock signal CPBB.

In FIG. 1A1 and FIG. 1A2, the first clocked forwarding-switch 103 is implemented as a transmission gate 110F1 and the second clocked forwarding-switch 105 is implemented as a gated inverter 105H1. In FIGS. 1B1-1C1 and FIGS. 1B2-1C2, the first clocked forwarding-switch 103 is implemented as a transmission gate 110F1 and the second clocked forwarding-switch 105 is implemented as a transmission gate 110H1.

In FIGS. 1A1-1C1 and FIGS. 1A2-1C2, the master latch 104 is implemented with an inverter 110G and a clocked inverter 110F2 which are cross coupled with each other, and the slave latch 106 is implemented with an inverter 110I and a clocked inverter 110H2 which are cross coupled with each other. In FIG. 1C1 and FIG. 1C2, the inverter 110G in the master latch 104 is a resettable inverter, and the clocked inverter 110H2 in the slave latch 106 is a resettable clocked inverter.

In FIGS. 1A1-1C1 and FIGS. 1A2-1C2, the input device 101 includes a gated inverter 110D and a gated inverter 110E. The gated inverter 110D is configured to receive a data signal D, and the gated inverter 110E is configured to receive a scan signal SI. Each of the gated inverter 110D and the gated inverter 110E includes a first part (labeled correspondingly as 110Dp and 110Ep) having the PMOS transistors and a second part (labeled correspondingly as 110Dn and 110En) having the NMOS transistors. In some embodiments, the input device 101 includes the gated inverter 110D but excludes the gated inverter 110E.

In FIGS. 1A1-1C1 and FIGS. 1A2-1C2, the transmission gate 110F1 is configured to receive the inverted clock signal CPB and the in-phase clock signal CPBB. When the inverted clock signal CPB is at logic LOW (and the in-phase clock signal CPBB is at logic HIGH), none of the data signal D from the gated inverter 110D and the scan signal SI from the gated inverter 110E is transmitted to the input node ml_ax of the master latch 104. When the inverted clock signal CPB is at logic HIGH (and the in-phase clock signal CPBB is at logic LOW), the inverse of the data signal D or the scan signal SI is transmitted to the input node ml_ax of the master latch 104.

In FIGS. 1A1-1C1 and FIGS. 1A2-1C2, the master latch 104 includes an inverter 110G and a clocked inverter 110F2 driven by the clock signals CPB and CPBB. The output of the inverter 110G is connected to the input of the clocked inverter 110F2, while the output of the clocked inverter 110F2 is connected to the input of the inverter 110G. When the clock signal CPB is at logic HIGH (and the clock signal CPBB is at logic LOW), the master latch 104 is at the unlatched state, the signal at the output node ml_b of the master latch 104 is the inverse of the signal at the input node ml_ax of the master latch 104. Consequently, the signal at the output node ml_b becomes the inverse of the selected input signal (which is either the data signal D received from the input device 101 or the scan signal SI received from the input device 101). Meanwhile, the second clocked forwarding-switch 105 is set to the non-connected state by the clock signals CPB and CPBB, and the input node sl_a of the slave latch 106 is decoupled from the master latch 104. Thereafter, when the inverted clock signal CPB is changed to logic LOW (and the in-phase clock signal CPBB is changed to logic HIGH), the master latch 104 is changed to the latched state, the signal in the master latch 104 is maintained during the time period that the clock signal CPB at logic LOW (and the clock signal CPBB at logic HIGH). The latched signal value at the output node ml_b is the signal value of the selected input signal (received from the input device 101) at a first falling edge of the clock signal CPB, as the clock signal CPB is changed to logic LOW.

When the clock signal CPB is changed to logic LOW (and the clock signal CPBB is changed to logic HIGH), the second clocked forwarding-switch 105 is changed to the connected state by the clock signals CPB and CPBB, and the latched signal in the master latch 104 is either transmitted from the input node ml_ax to the input node sl_a of the slave latch 106 (as in FIG. 1A1 and FIG. 1A2) or from the output node ml_b to the input node sl_a of the slave latch 106 (as in FIGS. 1B1-1C1 and FIGS. 1B2-1C2).

In FIGS. 1A1-1C1 and FIGS. 1A2-1C2, the slave latch 106 includes an inverter 110I and a clocked inverter 110H2 driven by the clock signals CPB and CPBB. The output of the inverter 110I is connected to the input of the clocked inverter 110H2, while the output of the clocked inverter 110H2 is connected to the input of the inverter 110I. When the clock signal CPB is at logic LOW (and the signal CPBB is at logic HIGH), the slave latch 106 is at the unlatched state, and the signal at the output node sl_bx of the slave latch 106 is the inverse of the signal at the input node sl_a of the slave latch 106. Consequently, the inverse of the latched signal at the output node ml_b of the master latch 104 is transmitted to the output node sl_bx of the slave latch 106. Thereafter, when the clock signal CPB is changed to logic HIGH (and the signal CPBB is changed to logic LOW), the slave latch 106 is changed to the latched state, the signal at the output node sl_bx of the slave latch 106 is maintained, and the latched signal value at the output node sl_bx after the current rising edge of the clock signal CPB is the inverse of the latched signal at the output node ml_b which is latched after the previous falling edge (the first falling edge) of the clock signal CPB.

During the time period when the clock signal CPB is at logic HIGH after the current rising edge of the clock signal CPB, the signal value $Q_{n+1}$ at the output Q of the output driver 109 (which is implemented as an inverter 110J) is equal to the signal value of the selected input signal (received from the input device 101) at the previous falling edge (the first falling edge) of the clock signal CPB.

In FIGS. 1A1-1C1 and FIGS. 1A2-1C2, at least the first clocked forwarding-switch 103 and the second clocked forwarding-switch 105 are implemented with strong transistors, while the clocked inverter 110F2 and the clocked inverter 110H2 are implemented with weak transistors. A CMOS inverter implemented with strong transistors has larger driving strength than a CMOS inverter implemented with weak transistors. A CMOS buffer implemented with strong transistors has larger driving strength than a CMOS buffer implemented with weak transistors. In some embodiments, the input device 101 and/or the output driver 109 are also implemented with strong transistors. In some embodiments, at least one of the inverter 110G of the master latch 104 and the inverter 1101 of the slave latch 106 is implemented with strong transistors as well.

FIG. 2 is a floor plan of the integrated circuits 100A-100C in FIGS. 1A1-1C1 and FIGS. 1A2-1C2, in accordance with some embodiments. In FIG. 2, the input device 101, the first clocked forwarding-switch 103, the second clocked forwarding-switch 105, and the output driver 109 are implemented correspondingly in layout areas “D”, “F1”, “F2”, and “J”. The clocked inverter 110F2 and the clocked inverter 110H2 are implemented correspondingly in layout areas “F2” and “H2”.

The integrated circuits in FIG. 2 includes a strong PMOS active-region structure 220P extending in the X-direction, a strong NMOS active-region structure 220N extending in the X-direction, a weak PMOS active-region structure 230P extending in the X-direction, and a weak NMOS active-region structure 230N extending in the X-direction. Each of the input device 101, the first clocked forwarding-switch 103, the second clocked forwarding-switch 105, and the output driver 109 (correspondingly in the layout areas “D”, “F1”, “F2”, and “J”) is constructed with p-channel strong transistors in the strong PMOS active-region structure 220P and n-channel strong transistors in the strong NMOS active-region structure 220N. Each of the clocked inverter 110F2 and the clocked inverter 110H2 (correspondingly in the layout areas “F2” and “H2”) is constructed with p-channel weak transistors in the weak PMOS active-region structure 230P and n-channel weak transistors in the weak NMOS active-region structure 230N. Each of the input device 101, the first clocked forwarding-switch 103, the second clocked forwarding-switch 105, and the output driver 109 is implemented as a class-one device, while each of the clocked inverter 110F2 and the clocked inverter 110H2 is implemented as a class-two device. In some alternative embodiments, at least one of the input device 101 and the output driver 109 is not implemented as a class-one device.

In the circuit cell of FIG. 2, the average gate width of the strong transistors with p-channels in the class-one devices is larger than the average gate width of the weak transistors with p-channels in the class-two devices, and the average gate width of the strong transistors with n-channels in the class-one devices is larger than the average gate width of the weak transistors with n-channels in the class-two devices.

In some embodiments, when the active-region structures are formed with fin structures, the transistors fabricated in the strong PMOS active-region structure 220P and in the weak PMOS active-region structures 230P are correspondingly strong p-channel FinFETs and weak p-channel FinFETs, while the transistors fabricated in the strong NMOS active-region structure 220N and in the weak NMOS active-region structures 230N are correspondingly strong n-channel FinFETs and weak n-channel FinFETs. The number of fins in the strong PMOS active-region structure 220P having p-channel strong transistors is larger than the number of fins in the weak PMOS active-region structure 230P having p-channel weak transistors, and the number of fins in the strong NMOS active-region structure 220N having n-channel strong transistors is larger than the number of fins in the weak NMOS active-region structure 230N having n-channel weak transistors. In one specific example, each of the strong PMOS active-region structure 220P and the strong NMOS active-region structure 220N has three fins, while each of the weak PMOS active-region structure 230P and the weak NMOS active-region structure 230N has two fins.

In some embodiments, when the active-region structures are formed with nano-sheet structures, the transistors fabricated in the active-region structures are nano-sheet transistors. The number of nano-sheets in the strong PMOS active-region structure 220P having p-channel strong transistors is larger than the number of nano-sheets in the weak PMOS active-region structure 230P having p-channel weak transistors, and the number of nano-sheets in the strong NMOS active-region structure 220N having n-channel strong transistors is larger than the number of nano-sheets in the weak NMOS active-region structure 230N having n-channel weak transistors.

In one example implementation, each of the strong PMOS active-region structure 220P and the strong NMOS active-region structure 220N has two nano-sheets which have a width of 32 nanometers along the Y-direction, while each of the weak PMOS active-region structure 230P and the weak NMOS active-region structure 230N has one nano-sheet which has a width of 32 nanometers along the Y-direction.

In another example implementation, each of the strong PMOS active-region structure 220P and the strong NMOS active-region structure 220N has two nano-sheets which have a width of 32 nanometers along the Y-direction, while each of the weak PMOS active-region structure 230P and the weak NMOS active-region structure 230N has one nano-sheet which has a width along the Y-direction that is less than 32 nanometers (e.g., 26 nanometers or 19 nanometers).

In still another example implementation, each of the strong PMOS active-region structure 220P, the strong NMOS active-region structure 220N, the weak PMOS active-region structure 230P, and the weak NMOS active-region structure 230N has two nano-sheets. The width of the nano-sheets in the strong PMOS active-region structure 220P (e.g., 42 nanometers) is larger than the width of the nano-sheets in the weak PMOS active-region structure 230P (e.g., 32 nanometers), and the width of the nano-sheets in the strong NMOS active-region structure 220N (e.g., 30 nanometers) is larger than the width of the nano-sheets in the weak NMOS active-region structure 230N (e.g., 16 nanometers).

In some embodiments, when the active-region structures are formed with nano-wire structures, the transistors fabricated in the active-region structures are nano-wire transistors. The number of nano-wires in the strong PMOS active-region structure 220P having p-channel strong transistors is larger than the number of nano-wires in the weak PMOS active-region structure 230P having p-channel weak transistors, and the number of nano-wires in the strong NMOS active-region structure 220N having n-channel strong transistors is larger than the number of nano-wires in the weak NMOS active-region structure 230N having n-channel weak transistors.

In some embodiments, each of the active-region structures is characterized with a structure-width measured along the Y-direction which is perpendicular to the X-direction. The structure-width of the strong PMOS active-region structure 220P having p-channel strong transistors is larger than the structure-width of the weak PMOS active-region structure 230P having p-channel weak transistors, and the structure-width of the strong NMOS active-region structure 220N having n-channel strong transistors is larger than the structure-width of the weak NMOS active-region structure 230N having n-channel weak transistors. As one specific example, in some embodiments, when the number of fins in the strong PMOS active-region structure 220P is larger than the number of fins in the weak PMOS active-region structure 230P, the structure-width of the strong PMOS active-region structure 220P is also larger than the structure-width of the weak PMOS active-region structure 230P; when the number of fins in the strong NMOS active-region structure 220N is larger than the number of fins in the weak NMOS active-region structure 230N, the structure-width of the strong NMOS active-region structure 220N is also larger than the structure-width of the weak NMOS active-region structure 230N.

In FIG. 2, for driving the first clocked forwarding-switch 103 (e.g., the transmission gate 110F1), the in-phase clock signal CPBB is applied to a gate-conductor 272F1 intersecting the strong PMOS active-region structure 220P, and the inverted clock signal CPB is applied to a gate-conductor 274F1 intersecting the strong NMOS active-region structure 220N. For driving the clocked inverter 110F2, the in-phase clock signal CPBB is applied to a gate-conductor 272F2 intersecting the weak NMOS active-region structure 230N, and the inverted clock signal CPB is applied to a gate-conductor 274F2 intersecting the weak PMOS active-region structure 230P. The output of the first clocked forwarding-switch 103 (e.g., the transmission gate 110F1) is conductively connected to the output of the clocked inverter 110F2 through a connection conductor 250 extending in the Y-direction.

In FIG. 2, for driving the second clocked forwarding-switch 105 (e.g., the gated inverter 105H1 or the transmission gate 110H1), the in-phase clock signal CPBB is applied to a gate-conductor 272H1 intersecting the strong NMOS active-region structure 220N, the inverted clock signal CPB is applied to a gate-conductor 274H1 intersecting the strong PMOS active-region structure 220P. For driving the clocked inverter 110H2, the in-phase clock signal CPBB is applied to a gate-conductor 272H2 intersecting the weak PMOS active-region structure 230P, and the inverted clock signal CPB is applied to a gate-conductor 274H2 intersecting the weak NMOS active-region structure 230N. The output of the second clocked forwarding-switch 105 (e.g., the gated inverter 105H1 or the transmission gate 110H1) is conductively connected to the output of the clocked inverter 110H2 through a connection conductor 260 extending in the Y-direction.

Figure 3A:
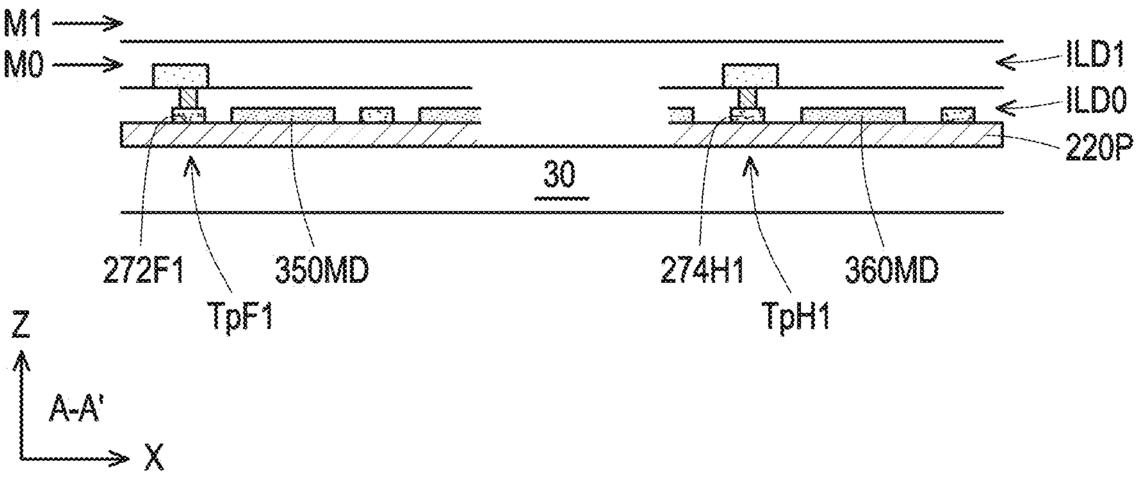
FIGS. 3A-3D are schematics of the cross-sectional views in various cutting planes of the integrated circuit in FIG. 2, in accordance with some embodiments.
Figure 3B:
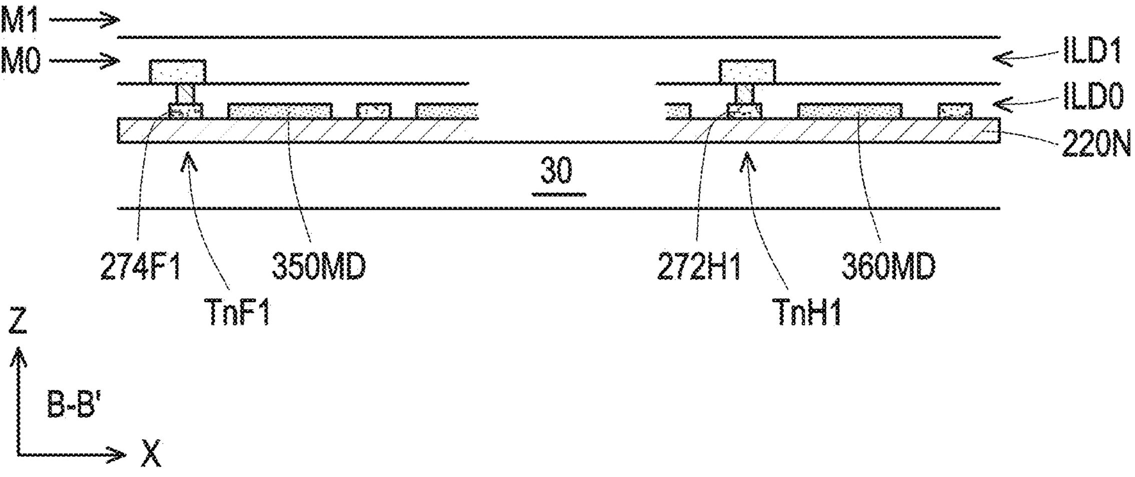
Figure 3C:
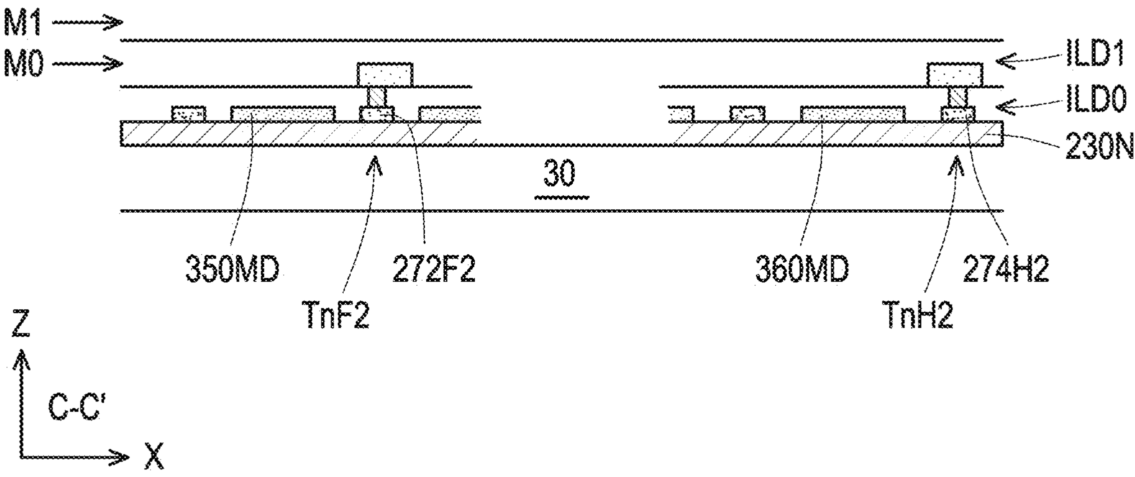
Figure 3D:
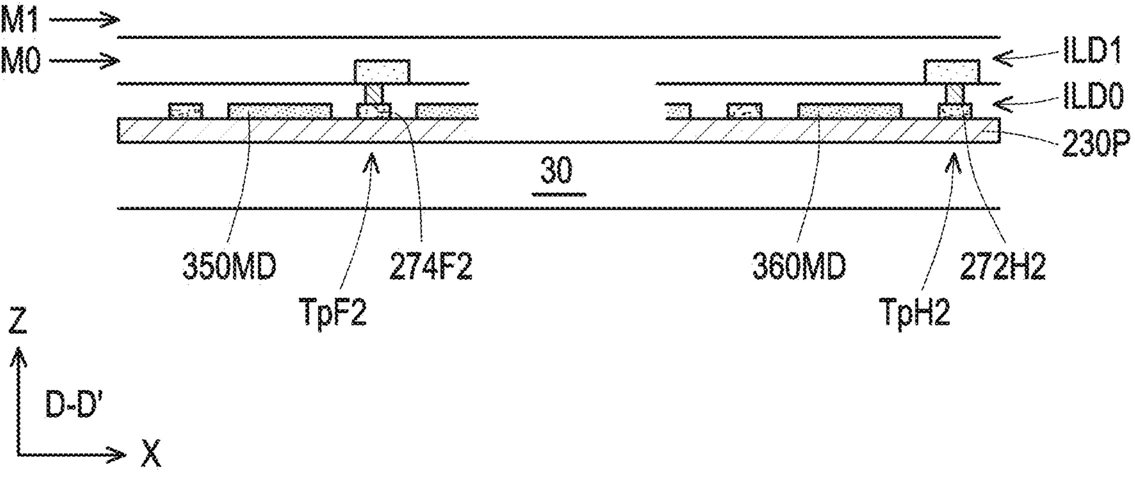
Figure 4A:
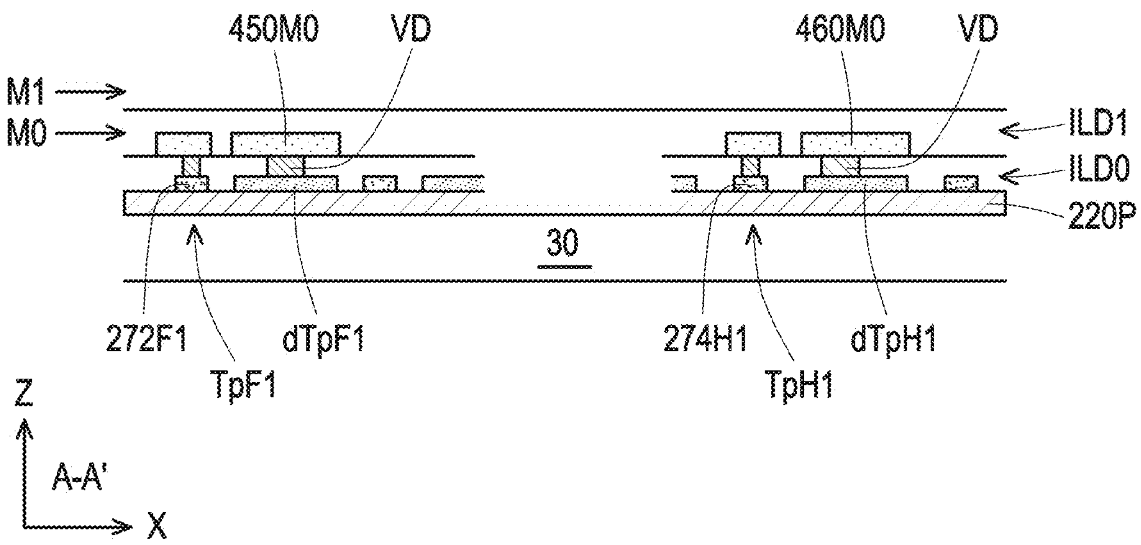
FIGS. 4A-4D are schematics of the cross-sectional views in various cutting planes of the integrated circuit in FIG. 2, in accordance with some embodiments.
Figure 4B:
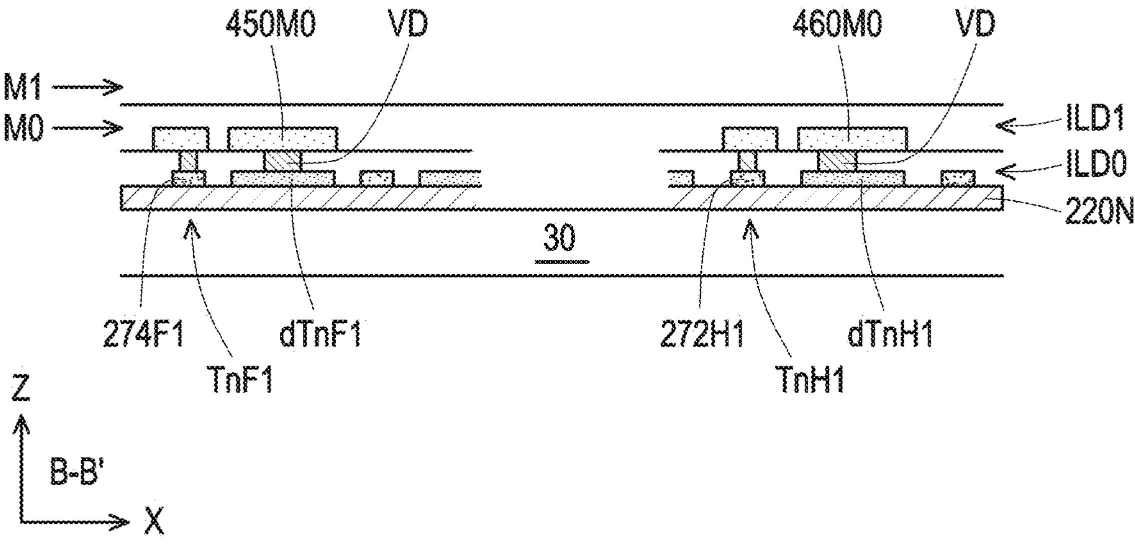
Figure 4C:
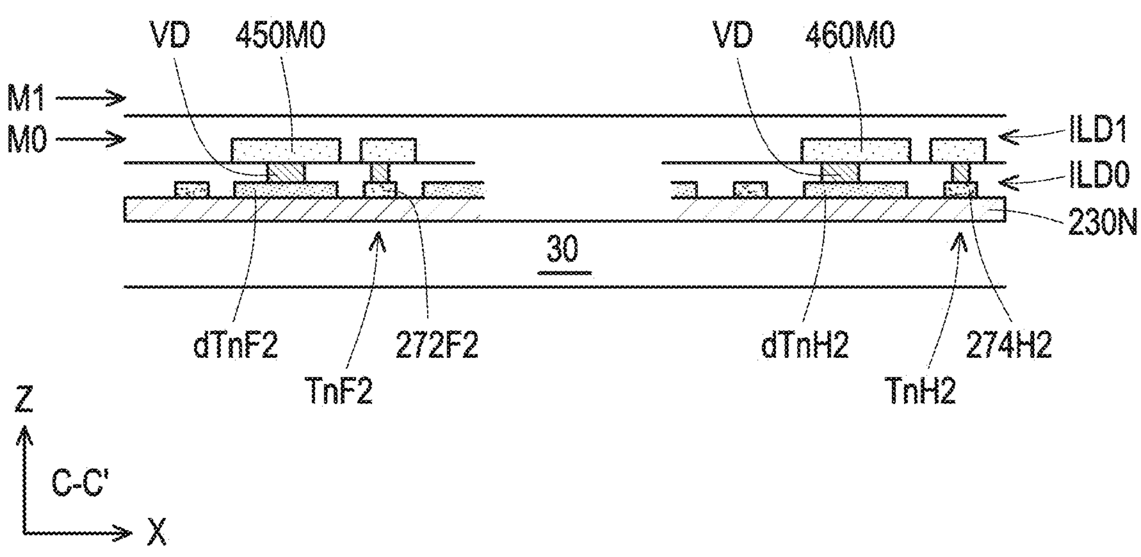
Figure 4D:
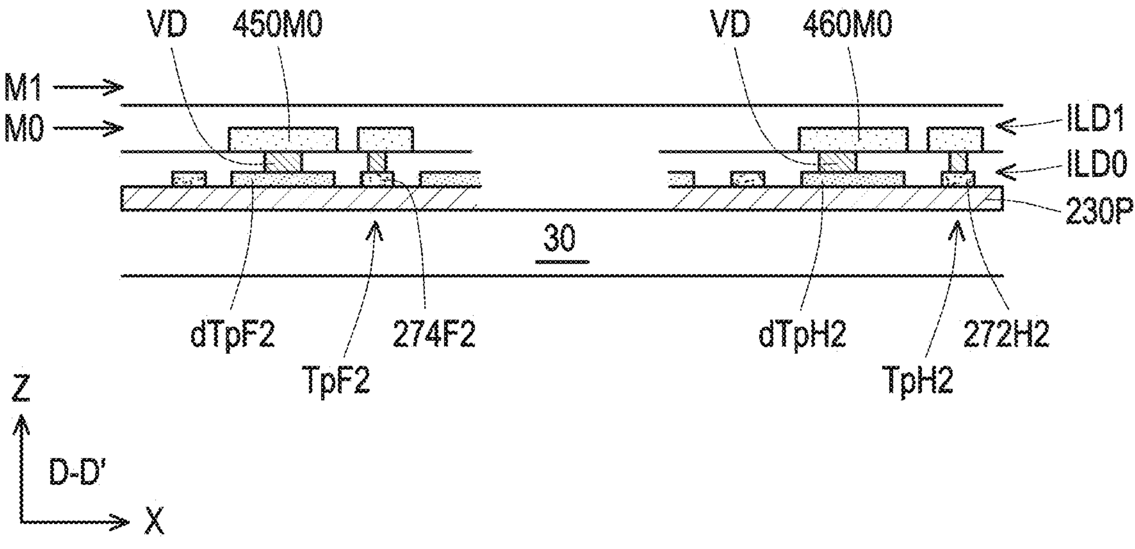
Figure 5A:
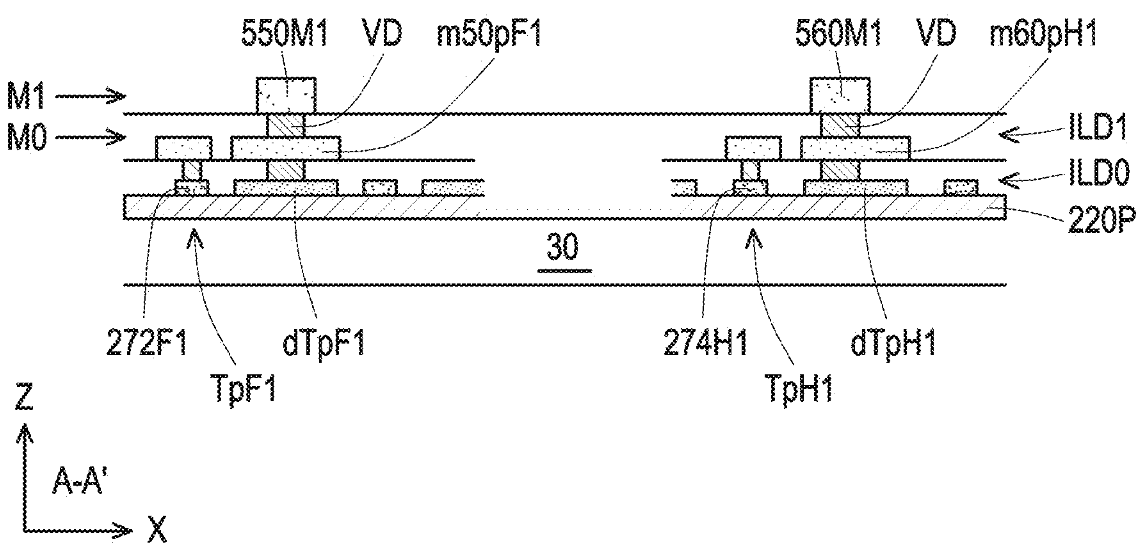
FIGS. 5A-5D are schematics of the cross-sectional views in various cutting planes of the integrated circuit in FIG. 2, in accordance with some embodiments.

FIGS. 3A-3D, FIGS. 4A-4D, and FIGS. 5A-5D are schematics of the cross-sectional views in various cutting planes of the integrated circuit in FIG. 2, in accordance with some embodiments. In the cross-sectional views of the cutting plane A-A', as shown in FIG. 3A, FIG. 4A and FIG. 5A, the gate-conductors 272F1 and 274H1 intersect the strong PMOS active-region structure 220P correspondingly at the p-channel regions of strong transistors TpF1 and TpH1. In the cross-sectional views of the cutting plane B-B', as show in FIG. 3B, FIG. 4B and FIG. 5B, each of the gate-conductors 274F1 and 272H1 intersects the strong NMOS active-region structure 220N correspondingly at the n-channel region of strong transistors TnF1 and TnH1. In the cross-sectional views of the cutting plane C-C', as show in FIGS. 3C-5C, the gate-conductors 272F2 and 274H2 intersect the weak NMOS active-region structure 230N correspondingly at the n-channel regions of weak transistors TnF2 and TnH2. In the cross-sectional views of the cutting plane D-D', as show in FIGS. 3D-5D, each of the gate-conductors 274F2 and 272H2 intersects the weak PMOS active-region structure 230P correspondingly at the p-channel regions of weak transistors TpF2 and TpH2.

In some embodiments, as shown in FIGS. 3A-3D, the connection conductor 250 and the connection conductor 260 are correspondingly implemented as terminal-conductors 350MD and 360MD. The terminal-conductor 350MD intersects the strong active-region structures 220P and 220N correspondingly at the drain regions of the strong transistors TpF1 and TnF1. The terminal-conductor 350MD also intersects the weak active-region structures 230N and 230P correspondingly at the drain regions of the weak transistors TnF2 and TpF2. The terminal-conductor 360MD intersects the strong active-region structures 220P and 220N correspondingly at the drain regions of the strong transistors TpH1 and TnH1. The terminal-conductor 360MD also intersects the weak active-region structures 230N and 230P correspondingly at the drain regions of the weak transistors TnH2 and TpH2. The terminal-conductors 350MD and 360MD are covered with an interlayer dielectric ILD0, and a first metal layer (e.g., metal layer M0) having conducting lines is deposited on the interlayer dielectric ILD0. The interlayer dielectric ILD0 also covers various gate-conductors.

In some embodiments, as shown in FIGS. 4A-4D, the connection conductor 250 and the connection conductor 260 are implemented as vertical conducting lines 450M0 and 460M0 extending along the Y-direction in a first metal layer (e.g., metal layer M0) that is deposited on the interlayer dielectric ILD0 (which covers various gate-conductors and terminal-conductors). In some embodiments, as shown in FIGS. 5A-5D, the connection conductor 250 and the connection conductor 260 are implemented as vertical conducting lines 550M1 and 560M1 extending along the Y-direction in a second metal layer (e.g., metal layer M1) that is deposited on the interlayer dielectric ILD1 (which covers various conducting lines in the first metal layer).

Figure 5B:
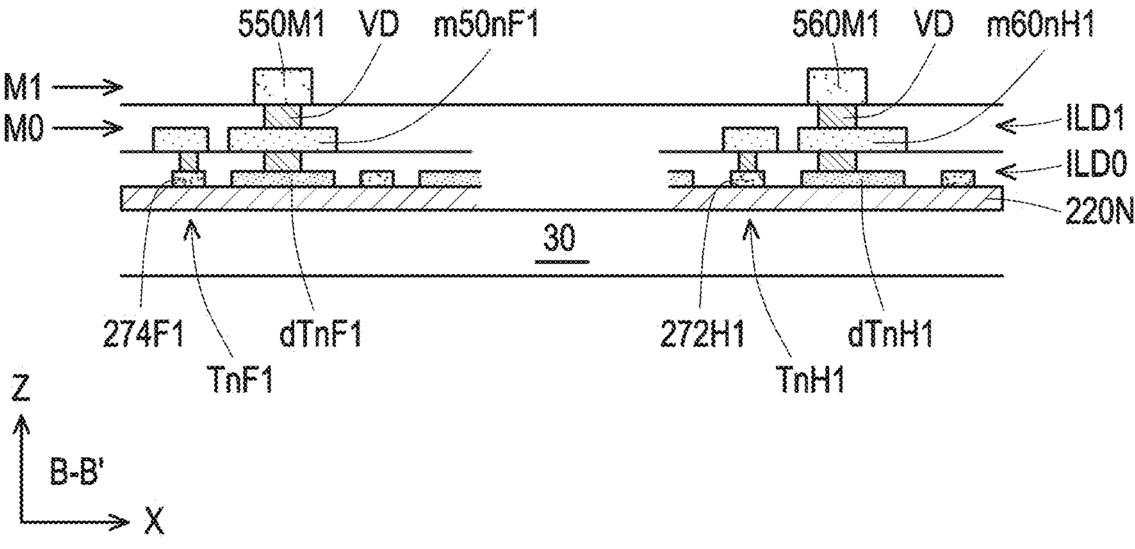
Figure 5C:
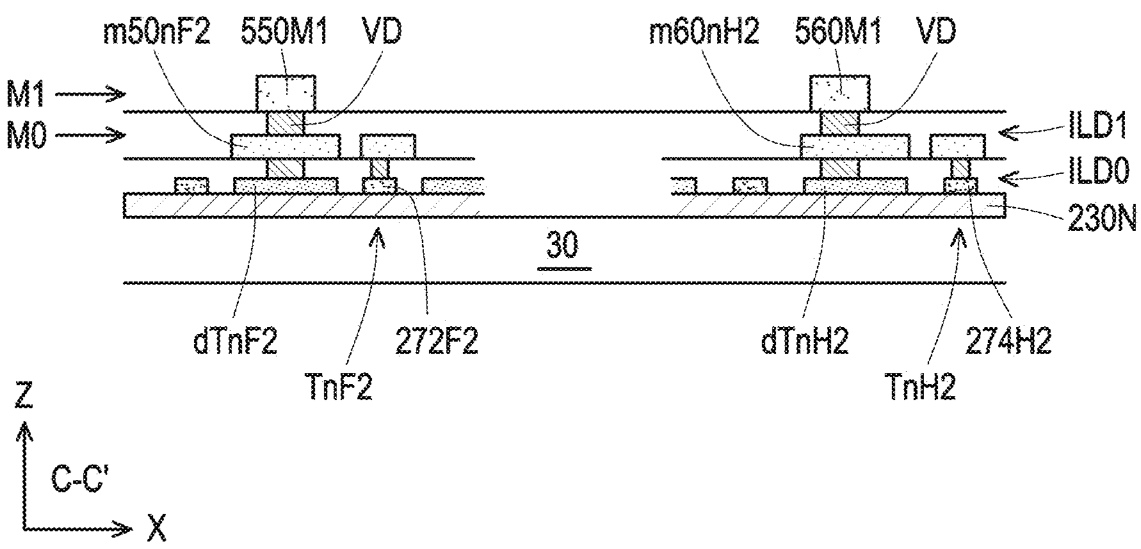
Figure 5D:
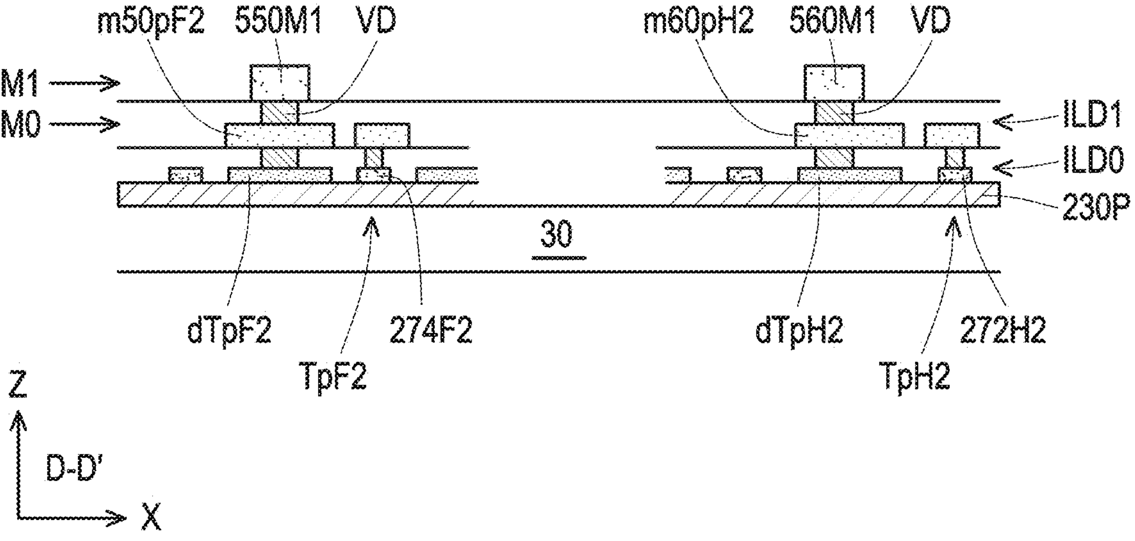

In FIG. 4A and FIG. 5A, the terminal-conductors dTpF1 and dTpH1 intersect the strong PMOS active-region structure 220P correspondingly at the drain regions of the transistors TpF1 and TpH1. In FIG. 4B and FIG. 5B, the terminal-conductors dTnF1 and dTnH1 intersect the strong NMOS active-region structures 220N correspondingly at the drain regions of the strong transistors TnF1 and TnH1. In FIG. 4C and FIG. 5C, the terminal-conductors dTnF2 and dTnH2 intersect the weak NMOS active-region structures 230N correspondingly at the drain regions of the weak transistors TnF2 and TnH2. In FIG. 4D and FIG. 5D, the terminal-conductors dTpF2 and dTpH2 intersect the weak PMOS active-region structures 230P correspondingly at the drain regions of the weak transistors TpF2 and TpH2.

In FIGS. 4A-4D, the vertical conducting lines 450M0 and 460M0 extending in the Y-direction are in the first metal layer (e.g., metal layer M0). The vertical conducting line 450M0 is conductively connected to the terminal-conductors dTpF1, dTnF1, dTnF2, and dTpF2 with via connectors VD passing through the interlayer dielectric ILD0. The vertical conducting line 460M0 is conductively connected to the terminal-conductors dTpH1, dTnH1, dTnH2, and dTpH2 with via connectors VD passing through the interlayer dielectric ILD0.

In FIGS. 5A-5D, the vertical conducting lines 550M1 and 560M1 extending in the Y-direction are in the second metal layer (e.g., metal layer M1). The vertical conducting line 550M1 is consecutively connected to the terminal-conductors dTpF1, dTnF1, dTnF2, and dTpF2 through a first set of metal stubs in the first metal layer (e.g., metal layer M0), and the vertical conducting line 560M1 is conductively connected to the terminal-conductors dTpH1, dTnH1, dTnH2, and dTpH2 through a second set of metal stubs in the first metal layer (e.g., metal layer M0).

Specifically, the vertical conducting line 550M1 is conductively connected to the metal stubs m50*p*F1, m50*n*F1, m50*n*F2, and m50*p*F2 with via connectors V0 passing through the interlayer dielectric ILD1, while each of the metal stubs m50*p*F1, m50*n*F1, m50*n*F2, and m50*p*F2 is conductively connected to one of the terminal-conductors dTpF1, dTnF1, dTnF2, and dTpF2 correspondingly with a via connector VD passing through the interlayer dielectric ILD0. Similarly, the vertical conducting line 560M1 is conductively connected to the metal stubs m60*p*H1, m60*n*H1, m60*n*H2, and m60*p*H2 with via connectors V0 passing through the interlayer dielectric ILD1, while each of the metal stubs m60*p*H1, m60*n*H1, m60*n*H2, and m60*p*H2 is conductively connected to one of the terminal-conductors dTpH1, dTnH1, dTnH2, and dTpH2 correspondingly with a via connector VD passing through the interlayer dielectric ILD0.

In the embodiments of FIG. 2, class-one devices (such as, the first clocked forwarding-switch 103 and the second clocked forwarding-switch 105) are constructed with p-channel strong transistors and n-channel strong transistors. The p-channel strong transistors are fabricated in the strong PMOS active-region structure 220P and the n-channel strong transistors are fabricated in the strong NMOS active-region structure 220N. In some alternative embodiments, the p-channel strong transistors for constructing class-one devices are fabricated in at least two strong PMOS active-region structures. In some alternative embodiments, the n-channel strong transistors for constructing class-one devices are fabricated in at least two strong NMOS active-region structures.

Figure 6:
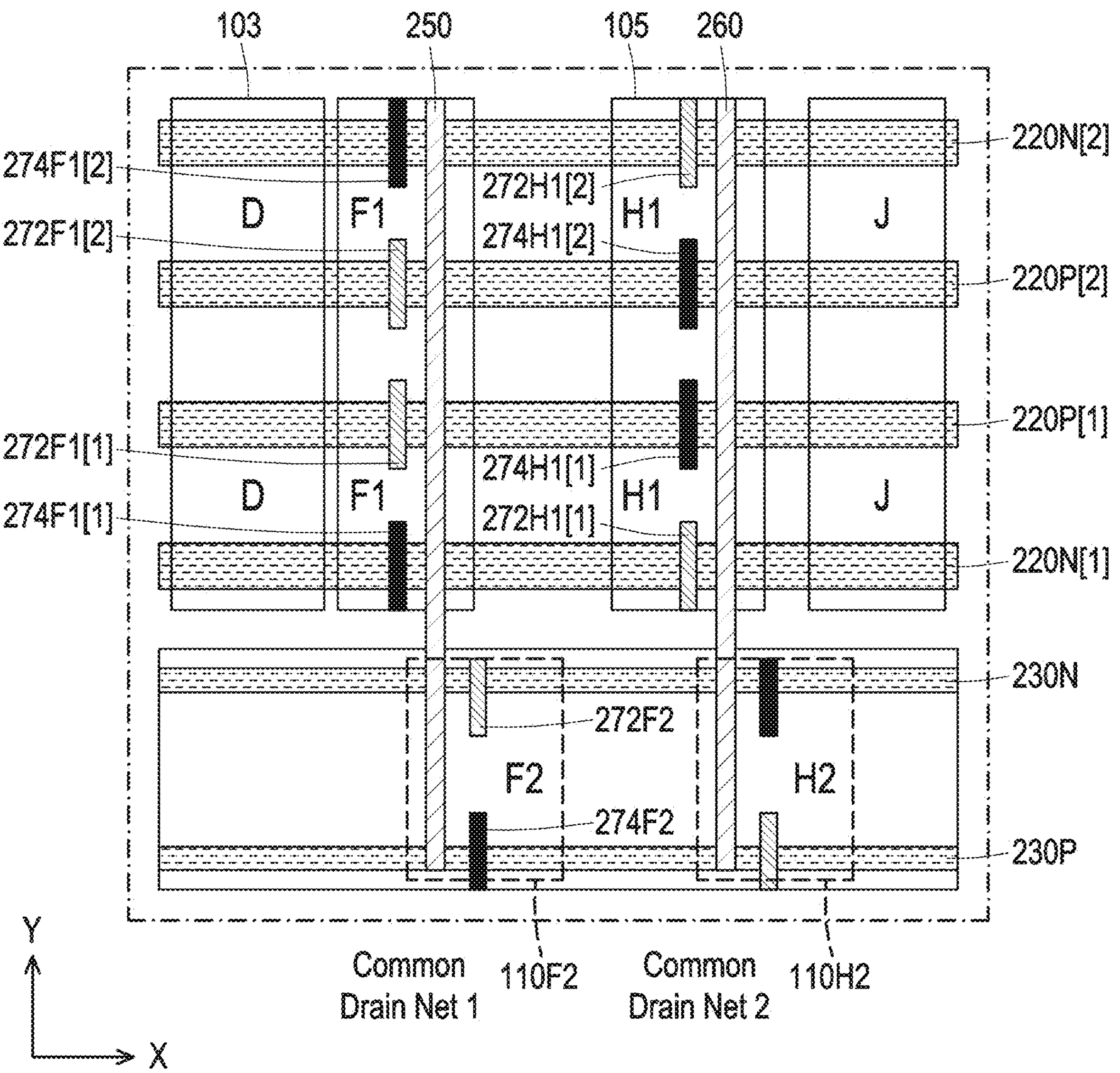
FIG. 6 is a floor plan of the integrated circuits 100A-100C in FIGS. 1A1-1C1 and FIGS. 1A2-1C2, in accordance with some embodiments.

FIG. 6 is a floor plan of the integrated circuits 100A-100C in FIGS. 1A1-1C1 and FIGS. 1A2-1C2, in accordance with some embodiments. The integrated circuits in FIG. 6 includes two strong PMOS active-region structures 220P[1]-220P[2] extending in the X-direction, two strong NMOS active-region structure 220N[1]-220N[2] extending in the X-direction, a weak PMOS active-region structure 230P extending in the X-direction, and a weak NMOS active-region structure 230N extending in the X-direction. Each of the input device 101, the first clocked forwarding-switch 103, the second clocked forwarding-switch 105, and the output driver 109 (correspondingly in the layout areas "D", "F1", "F2", and "J") is constructed with p-channel strong transistors in the strong PMOS active-region structures 220P[1]-220P[2] and with n-channel strong transistors in the NMOS active-region structures 220N[1]-220N[2]. Each of the clocked inverter 110F2 and the clocked inverter 110H2 (correspondingly in the layout areas "F2" and "H2") is constructed with p-channel weak transistors in the weak PMOS active-region structure 230P and with n-channel weak transistors in the weak NMOS active-region structure 230N.

In FIG. 6, gate-conductor 272F1[1] and 272F1[2] intersect correspondingly the strong PMOS active-region structure 220P[1] and 220P[2] at the channel regions of p-channel strong transistors, and gate-conductor 274F1[1] and 274F1[2] intersect correspondingly the strong NMOS active-region structure 220N[1] and 220N[2] at the channel regions of n-channel strong transistors. Gate-conductor 272F2[1] and 272F2[2] intersect correspondingly the strong NMOS active-region structure 220N[1] and 220N[2] at the channel regions of n-channel strong transistors, and gate-conductor 274F2[1] and 274F2[2] intersect correspondingly the strong PMOS active-region structure 220P[1] and 220P[2] at the channel regions of p-channel strong transistors.

In FIG. 6, for driving the first clocked forwarding-switch 103 (e.g., the transmission gate 110F1), the in-phase clock signal CPBB is applied to the gate-conductors 272F1[1]-272F1[2], and the inverted clock signal CPB is applied to the gate-conductors 274F1[1]-274F1[2]. For driving the second clocked forwarding-switch 105 (e.g., the gated inverter 105H1 or the transmission gate 110H1), the in-phase clock signal CPBB is applied to the gate-conductors 272H1[1]-272H1[2], and the inverted clock signal CPB is applied to the gate-conductors 274H1[1]-274H1[2].

In FIG. 6, for driving the clocked inverter 110F2 and the clocked inverter 110H2, the in-phase clock signal CPBB and the inverted clock signal CPB are applied to various gate-conductors in the same way as in FIG. 2. Additionally, in both FIG. 6 and FIG. 2, the output of the first clocked forwarding-switch 103 is conductively connected to the output of the clocked inverter 110F2 through the connection conductor 250, and the output of the second clocked forwarding-switch 105 is conductively connected to the output of the clocked inverter 110H2 through the connection conductor 260.

In FIG. 6, two strong transistors with the gate-conductors 272F1[1]-272F1[2] are parallelly connected with each other and two strong transistors with the gate-conductors 274F1[1]-274F1[2] are parallelly connected with each other. The two strong transistors with the gate-conductors 272F1[1]-272F1[2] substitute the strong transistor TpF1 with the gate-conductor 272F1 in FIG. 2, and the two strong transistors with the gate-conductors 274F1[1]-274F1[2] substitute the strong transistor TnF1 with 274F1 in FIG. 2, thereby the driving strength at the output of the first clocked forwarding-switch 103 in FIG. 6 is increased. Here, increasing the driving strength of the first clocked forwarding-switch 103 improves the switching speed of the master-slave flip-flop implemented according to the floor design of FIG. 6.

Similarly, in FIG. 6, two strong transistors with the gate-conductors 272H1[1]-272H1[2] are parallelly connected with each other and two strong transistors with the gate-conductors 274H1[1]-274H1[2] are parallelly connected with each other. The two strong transistors with the gate-conductors 272H1[1]-272H1[2] substitute the strong transistor TnH1 with the gate-conductor 272H1 in FIG. 2, and the two strong transistors with the gate-conductors 274H1[1]-274H1[2] substitute the strong transistor TpH1 with the gate-conductor 274H1 in FIG. 2, thereby the driving strength at the output of the second clocked forwarding-switch 105 in FIG. 6 is increased. Here, increasing the driving strength of the second clocked forwarding-switch 105 improves the switching speed of the master-slave flip-flop implemented according to the floor design of FIG. 6.

Additionally, because of the two strong PMOS active-region structures 220P[1]-220P[2] and the two strong NMOS active-region structures 220N[1]-220N[2], more strong transistors are available for constructing the input device 101 and the output driver 109 (which are correspondingly in layout areas "D" and "J") to increase the driving strengths of the input device 101 and the output driver 109. Increasing the driving strength at the output of the input device 101 improves the switching speed of the master-slave flip-flops in FIGS. 1A1-1C1 and FIGS. 1A2-1C2 implemented according to the floor design of FIG. 6. Increasing the driving strength at the output of the output driver 109 decreases the RC delay at the output of the output driver 109.

Figure 7:
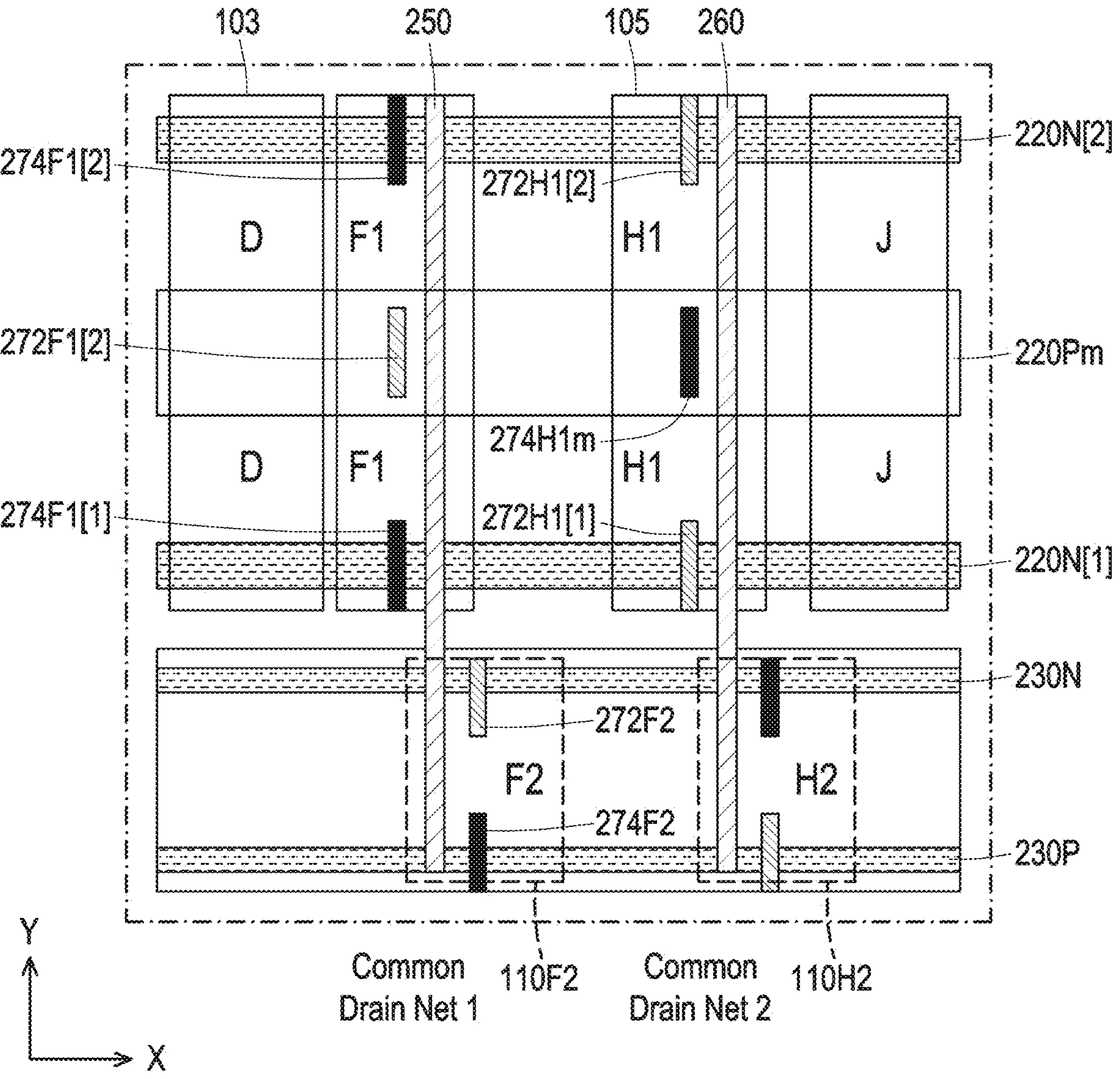
FIG. 7 is a floor plan of the integrated circuits 100A-100C in FIGS. 1A1-1C1 and FIGS. 1A2-1C2, in accordance with some embodiments.

In some alternative embodiments, the integrated circuits implemented according to the floor design of FIG. 6 are modified, whereby some of the strong active-region structure are merged. FIG. 7 is a floor plan of the integrated circuits 100A-100C in FIGS. 1A1-1C1 and FIGS. 1A2-1C2, in accordance with some embodiments. The strong PMOS active-region structure 220Pm in FIG. 7 is obtained by merging the strong PMOS active-region structures 220P[1] and 220P[2] in FIG. 6. Furthermore, the gate-conductors 272F1[1] and 272F1[2] are substituted with a merged gate-conductor 272F1*m*, and the gate-conductors 274H1[1] and 274H1[2] are substituted with a merged gate-conductor 274H1*m*.

In FIG. 6, the strong PMOS active-region structures 220P[1] and 220P[2] are adjacent to each other, and the strong PMOS active-region structures 220P[1] and 220P[2] are positioned between the two strong NMOS active-region structures 220N[1] and 220N[2]. In some alternative embodiments (not shown in figures), the strong NMOS active-region structures 220N[1] and 220N[2] are adjacent to each other, and the strong NMOS active-region structures 220N[1] and 220N[2] are positioned between the two strong PMOS active-region structures 220P[1] and 220P[2]. In some alternative embodiments (not shown in figures), the strong NMOS active-region structures 220N[1] and 220N[2] are merged as one strong NMOS active-region structure 220Nm, which is positioned between the two strong PMOS active-region structures 220P[1] and 220P[2].

Figure 8:
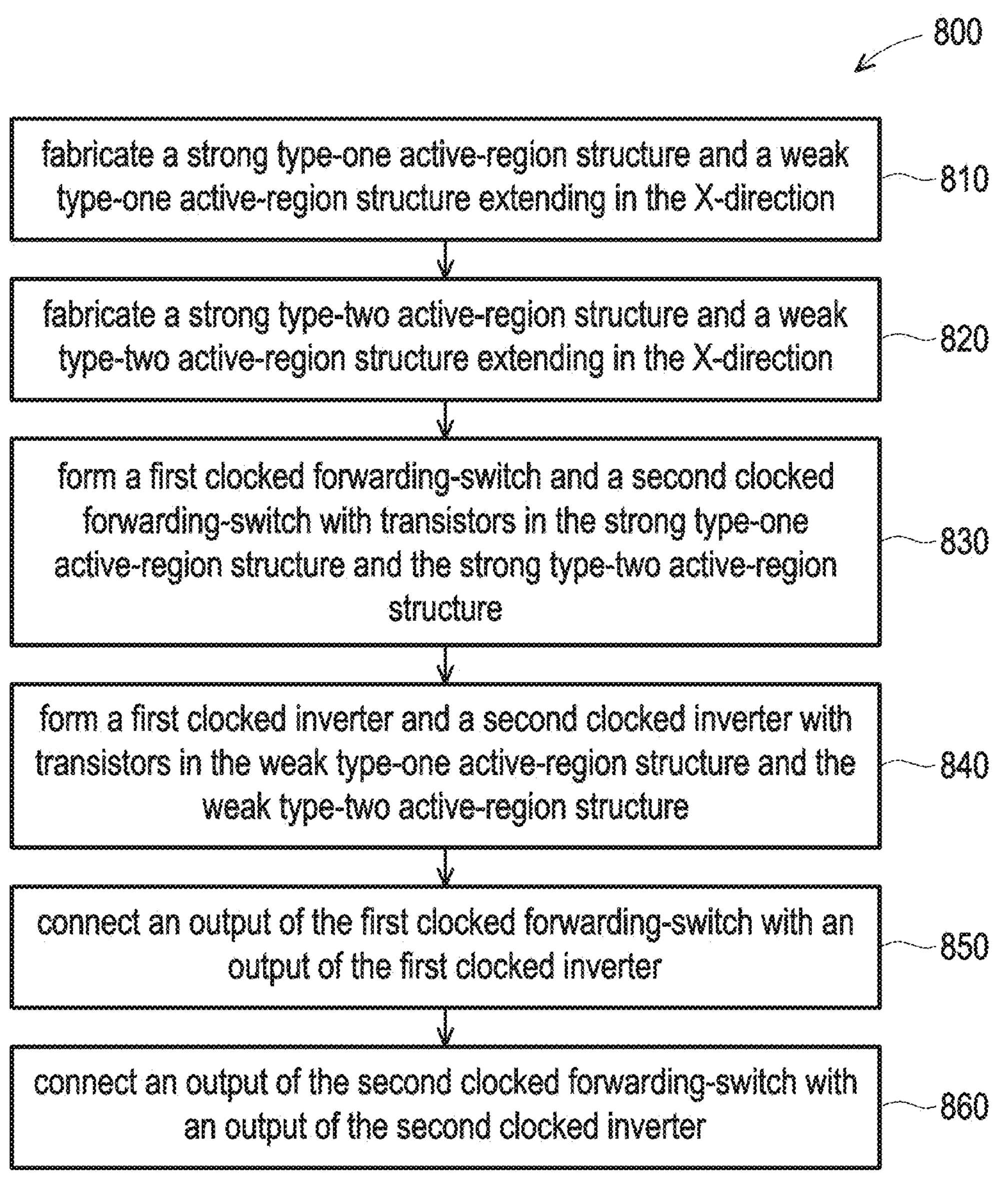
FIG. 8 is a flowchart of a method of fabricating an integrated circuit, in accordance with some embodiments.

FIG. 8 is a flowchart of a method 800 of fabricating an integrated circuit, in accordance with some embodiments. The sequence in which the operations of method 800 are depicted in FIG. 8 is for illustration only; the operations of method 800 are capable of being executed in sequences that differ from that depicted in FIG. 8. It is understood that additional operations may be performed before, during, and/or after the method 800 depicted in FIG. 8, and that some other processes may only be briefly described herein.

In operation 810 of method 800, a strong type-one active-region structure and a weak type-one active-region structure extending in the X-direction are fabricated. In operation 820 of method 800, a strong type-two active-region structure and a weak type-two active-region structure extending in the X-direction are fabricated. In the example embodiments as shown in FIG. 2 and FIGS. 3A-3D, the strong PMOS active-region structure 220P and the weak PMOS active-region structure 230P are fabricated in operation 810 (or alternatively in operation 820), and the strong NMOS active-region structure 220N and the weak NMOS active-region structure 230N are fabricated in operation 820 (or alternatively in operation 810). After operations 810 and 820, the fabrication process proceeds to operation 830 and 840.

In operation 830 of method 800, a first clocked forwarding-switch and a second clocked forwarding-switch are formed with strong type-one transistors in the strong type-one active-region structure and strong type-two transistors in the strong type-two active-region structure. In the example embodiments as shown in FIG. 2 and FIGS. 3A-3D, the first clocked forwarding-switch F1 and the second clocked forwarding-switch F2 are formed with strong PMOS transistors in the strong PMOS active-region structure 220P and strong NMOS transistors the strong NMOS active-region structure 220N. In operation 840 of method 800, a first clocked inverter and a second clocked inverter are formed with weak type-one transistors in the weak type-one active-region structure and weak type-two transistors in the weak type-two active-region structure. In the example embodiments as shown in FIG. 2 and FIGS. 3A-3D, the clocked inverter 110F2 and the clocked inverter 110H2 are formed with weak PMOS transistors in the weak PMOS active-region structure 230P and weak NMOS transistors in the weak NMOS active-region structure 230N. After operations 830 and 840, the fabrication process proceeds to operation 850 and 860.

In operation 850 of method 800, an output of the first clocked forwarding-switch is connected with an output of the first clocked inverter. In operation 860 of method 800, an output of the second clocked forwarding-switch is connected with an output of the second clocked inverter. In a first example embodiment as shown in FIG. 2 and FIGS. 3A-3D, when the terminal-conductor 350MD is fabricated intersecting the strong active-region structures (i.e., 220P and 220N) and the weak active-region structures (i.e., 230P and 230N), the output of the first clocked forwarding-switch F1 is connected with the output of the first clocked inverter F2. When the terminal-conductor 360MD is fabricated intersecting the strong active-region structures (i.e., 220P and 220N) and the weak active-region structures (i.e., 230P and 230N), the output of the second clocked forwarding-switch H1 is connected with the output of the second clocked inverter H2.

In another example embodiment as shown in FIG. 2 and FIGS. 4A-4D, as the vertical conducting line 450M0 is fabricated in operation 860, the vertical conducting line 450M0 is fabricated connected to each of the terminal-conductors dTpF1, dTnF1, dTnF2, and dTpF2 with a via connector, whereby the output of the first clocked forwarding-switch F1 is connected with the output of the first clocked inverter F2. As the vertical conducting line 460M0 fabricated, the vertical conducting line 460M0 is connected to each of the terminal-conductors dTpH1, dTnH1, dTnH2, and dTpH2 with a via connector VD, whereby the output of the second clocked forwarding-switch H1 is connected with the output of the second clocked inverter H2.

Figure 9:
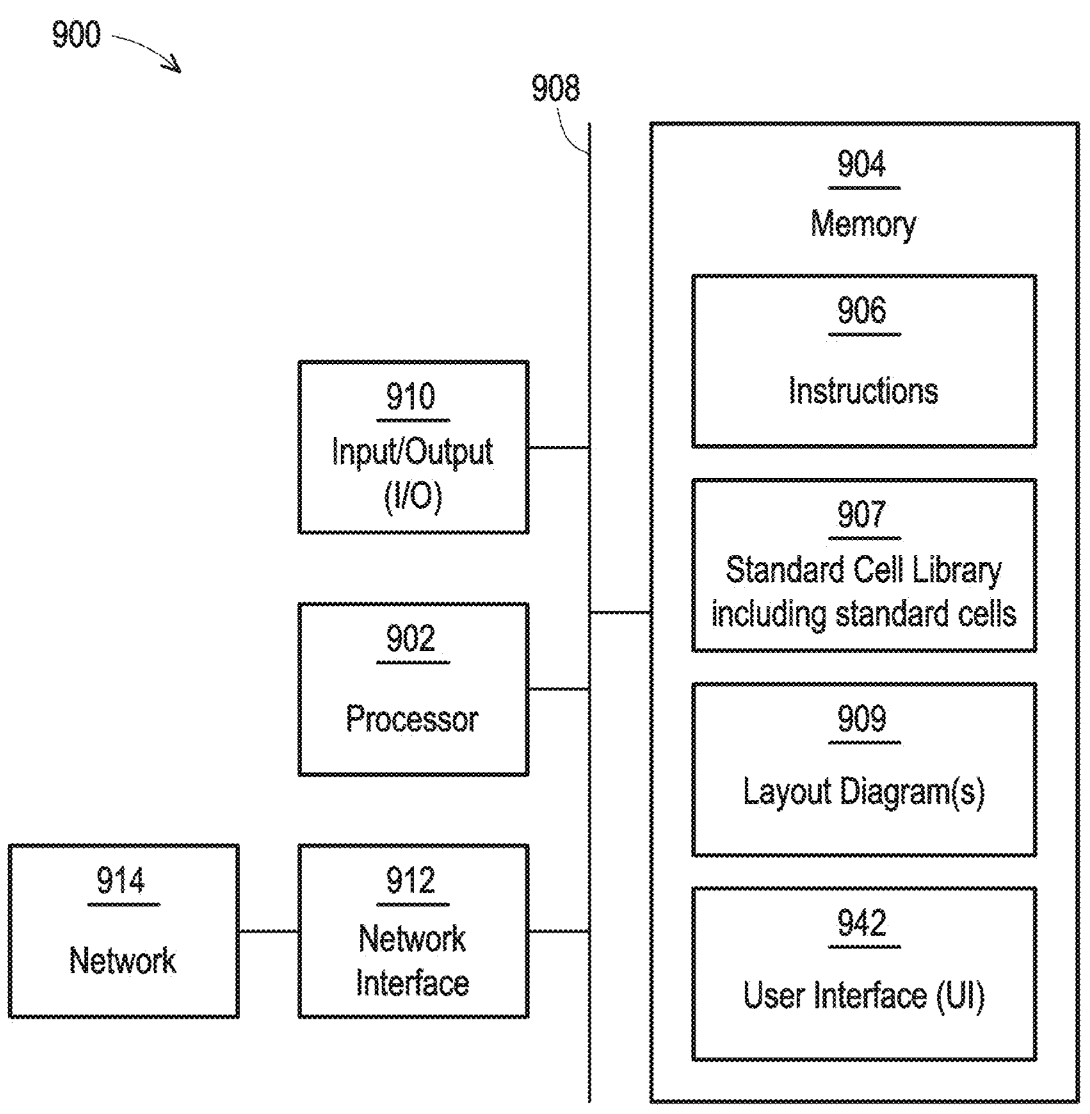
FIG. 9 is a block diagram of an electronic design automation (EDA) system in accordance with some embodiments.

FIG. 9 is a block diagram of an electronic design automation (EDA) system 900 in accordance with some embodiments.

In some embodiments, EDA system 900 includes an automatic placement and routing (APR) system. Methods described herein of designing layout diagrams represent wire routing arrangements, in accordance with one or more embodiments, are implementable, for example, using EDA system 900, in accordance with some embodiments.

In some embodiments, EDA system 900 is a general purpose computing device including a hardware processor 902 and a non-transitory, computer-readable storage medium 904. Storage medium 904, amongst other things, is encoded with, i.e., stores, computer program code 906, i.e., a set of executable instructions. Execution of instructions 906 by hardware processor 902 represents (at least in part) an EDA tool which implements a portion or all of the methods described herein in accordance with one or more embodiments (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores library 907 of standard cells including such standard cells as disclosed herein. In one or more embodiments, storage medium 904 stores one or more layout diagrams 909 corresponding to one or more layouts disclosed herein.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 900.

System 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a user interface (UI) through I/O interface 910. The information is stored in computer-readable medium 904 as UI 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 10:
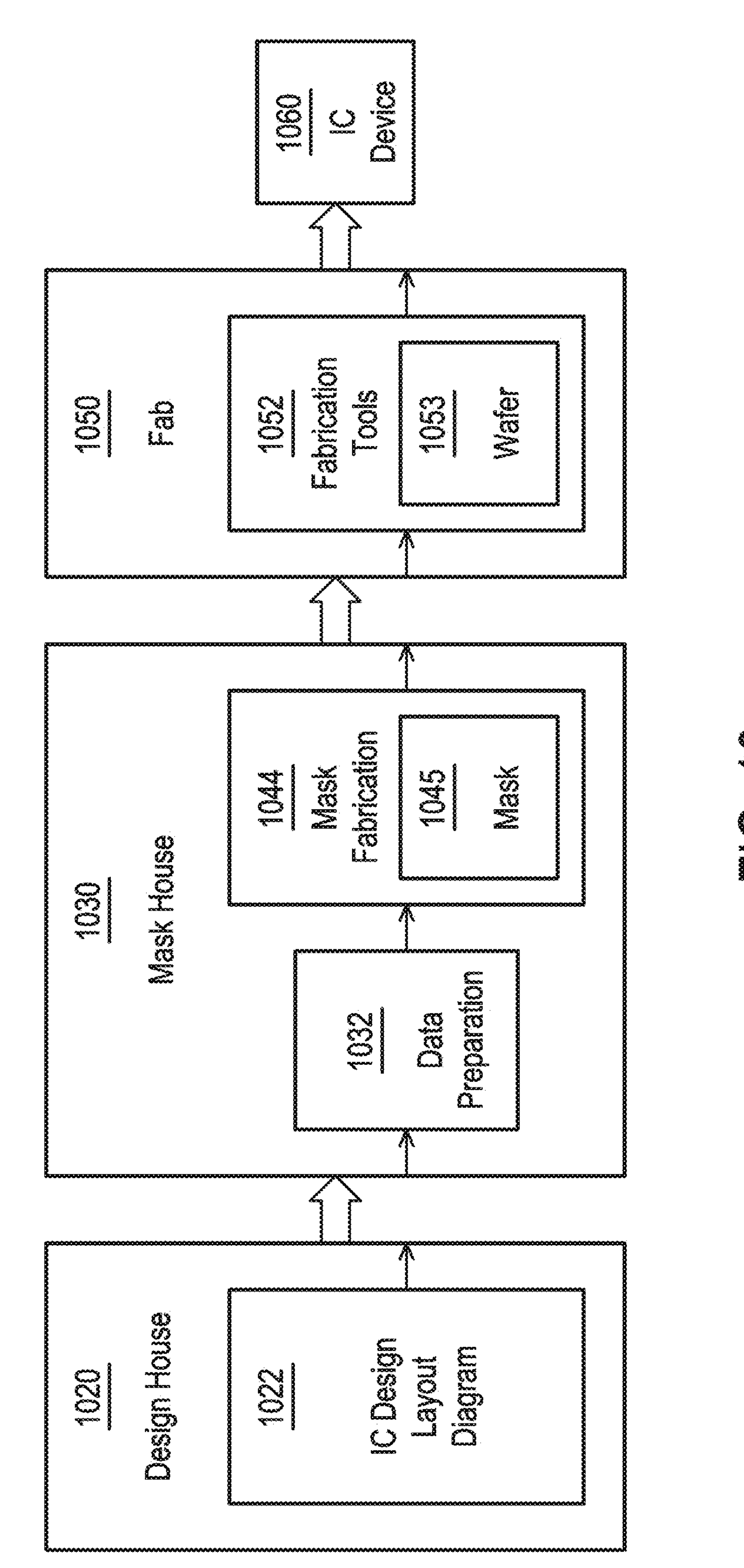
FIG. 10 is a block diagram of an integrated circuit (IC) manufacturing system, and an IC manufacturing flow associated therewith, in accordance with some embodiments.

FIG. 10 is a block diagram of an integrated circuit (IC) manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1000.

In FIG. 10, IC manufacturing system 1000 includes entities, such as a design house 1020, a mask house 1030, and an IC manufacturer/fabricator (fab) 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place and route. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file (RDF). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 10, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for photolithographic implementation effects during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 includes fabrication tools 1052 configured to execute various manufacturing operations on semiconductor wafer 1053 such that IC device 1060 is fabricated in accordance with the mask(s), e.g., mask 1045. In various embodiments, fabrication tools 1052 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multilevel interconnects, and the like (formed at subsequent manufacturing steps).

An aspect of the present disclosure relates to an integrated circuit. The integrated circuit includes a first clocked forwarding-switch and a second clocked forwarding-switch each implemented with strong transistors. The circuit also includes a first clocked inverter and a second clocked inverter each implemented with weak transistors, where an output of the first clocked forwarding-switch is conductively connected with an output of the first clocked inverter, and where an output of the second clocked forwarding-switch is conductively connected with an output of the second clocked inverter. The circuit also includes a first inverter having an input conductively connected to the output of the first clocked inverter and having an output conductively connected to an input of the first clocked inverter. The circuit also includes a second inverter having an input conductively connected to the output of the second clocked inverter and having an output conductively connected to an input of the second clocked inverter.

Another aspect of the present disclosure relates to an integrated circuit. The integrated circuit includes a first clocked forwarding-switch and a second clocked forwarding-switch each implemented with strong transistors. The circuit also includes a first clocked inverter and a second clocked inverter each implemented with weak transistors; strong active-region structures extending in a first direction and having the strong transistors therein, weak active-region structures extending in the first direction and having the weak transistors therein. The circuit also includes a first connection conductor extending in a second direction that is perpendicular to the first direction, where the first connection conductor conductively connects an output of the first clocked forwarding-switch with an output of the first clocked inverter. The circuit also includes a first inverter coupled between an input of the first clocked inverter and the first connection conductor, where the first inverter having an input conductively connected to the first connection conductor.

Still another aspect of the present disclosure relates to a method. The method includes fabricating a strong type-one active-region structure and a weak type-one active-region structure extending in a first direction; fabricating a strong type-two active-region structure and a weak type-two active-region structure extending in the first direction, forming a first clocked forwarding-switch and a second clocked forwarding-switch with strong type-one transistors in the strong type-one active-region structure and strong type-two transistors in the strong type-two active-region structure, forming a first clocked inverter with a first group of weak type-one transistors in the weak type-one active-region structure and a first group of weak type-two transistors in the weak type-two active-region structure. The method also includes forming a first connection conductor extending in a second direction that is perpendicular to the first direction; and connecting an output of the first clocked forwarding-switch and an output of the first clocked inverter with the first connection conductor.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit comprising:

a first clocked forwarding-switch and a second clocked forwarding-switch each implemented with strong transistors;

a first clocked inverter and a second clocked inverter each implemented with weak transistors, wherein an output of the first clocked forwarding-switch is conductively connected with an output of the first clocked inverter, and an output of the second clocked forwarding-switch is conductively connected with an output of the second clocked inverter;

a first inverter having an input conductively connected to the output of the first clocked inverter and having an output conductively connected to an input of the first clocked inverter; and a second inverter having an input conductively connected to the output of the second clocked inverter and having an output conductively connected to an input of the second clocked inverter.

2. The integrated circuit of claim 1, further comprising:

strong active-region structures having the strong transistors therein; and weak active-region structures having the weak transistors therein, wherein the strong active-region structures include at least two strong type-one active-region structures and at least one strong type-two active-region structure.

3. The integrated circuit of claim 2, wherein the strong active-region structures include at least two strong type-one active-region structures and at least two strong type-two active-region structures.

4. The integrated circuit of claim 2, wherein the strong active-region structures and the weak active-region structures are fin structures each associated with a number of fins, wherein the number of fins in a strong active-region structure having p-channel strong transistors is larger than the number of fins in a weak active-region structure having p-channel weak transistors, and the number of fins in a strong active-region structure having n-channel strong transistors is larger than the number of fins in a weak active-region structure having n-channel weak transistors.

5. The integrated circuit of claim 2, wherein the strong active-region structures and the weak active-region structures are nano-sheet structures each associated with a number of nano-sheets, wherein the number of nano-sheets in a strong active-region structure having p-channel strong transistors is larger than the number of nano-sheets in a weak active-region structure having p-channel weak transistors, and the number of nano-sheets in a strong active-region structure having n-channel strong transistors is larger than the number of nano-sheets in a weak active-region structure having n-channel weak transistors.

6. The integrated circuit of claim 2, wherein the strong active-region structures and the weak active-region structures are nano-wires structures each associated with a number of nano-wires, wherein the number of nano-wires in a strong active-region structure having p-channel strong transistors is larger than the number of nano-wires in a weak active-region structure having p-channel weak transistors, and the number of nano-wires in a strong active-region structure having n-channel strong transistors is larger than the number of nano-wires in a weak active-region structure having n-channel weak transistors.

7. The integrated circuit of claim 2, wherein a structure-width of a strong active-region structure having p-channel strong transistors is larger than a structure-width of a weak active-region structure having p-channel weak transistors, and the structure-width of a strong active-region structure having n-channel strong transistors is larger than the structure-width of a weak active-region structure having n-channel weak transistors.

8. The integrated circuit of claim 1, further comprising:

an input device having an output conductively connected to an input of the first clocked forwarding-switch; and an output driver having an input conductively connected to the output of the second inverter.

9. The integrated circuit of claim 8, wherein each of the input device and the output driver is implemented with strong transistors.

10. The integrated circuit of claim 8, wherein one of the input device or the output driver is implemented with strong transistors.

11. The integrated circuit of claim 1, wherein the first clocked forwarding-switch comprises a transmission gate coupled between an output of an input device and the input of the first inverter.

12. The integrated circuit of claim 1, wherein the second clocked forwarding-switch comprises a transmission gate coupled between the output of the first inverter and the input of the second inverter.

13. The integrated circuit of claim 1, wherein the second clocked forwarding-switch comprises a third clocked inverter coupled between the input of the first inverter and the input of the second inverter.

14. The integrated circuit of claim 1, wherein the first inverter comprises a resettable inverter, and the second clocked inverter comprises a resettable clocked inverter.

15. The integrated circuit of claim 1, wherein each of the first inverter and the second inverter comprises a corresponding inverter.

16. An integrated circuit comprising:

a first clocked forwarding-switch and a second clocked forwarding-switch each implemented with strong transistors;

a first clocked inverter and a second clocked inverter each implemented with weak transistors;

strong active-region structures extending in a first direction and having the strong transistors therein;

weak active-region structures extending in the first direction and having the weak transistors therein;

a first connection conductor extending in a second direction that is perpendicular to the first direction, wherein the first connection conductor conductively connects an output of the first clocked forwarding-switch with an output of the first clocked inverter; and a first inverter coupled between an input of the first clocked inverter and the first connection conductor, wherein the first inverter having an input conductively connected to the first connection conductor.

17. The integrated circuit of claim 16, further comprising:

an input device having an output conductively connected to an input of the first clocked forwarding-switch;

a second connection conductor extending in the second direction, wherein the second connection conductor conductively connects an output of the second clocked forwarding-switch with an output of the second clocked inverter; and a second inverter coupled between an input of the second clocked inverter and the second connection conductor, wherein the second inverter has an input conductively connected to the second connection conductor.

18. A method comprising:

fabricating a strong type-one active-region structure and a weak type-one active-region structure extending in a first direction;

fabricating a strong type-two active-region structure and a weak type-two active-region structure extending in the first direction;

forming a first clocked forwarding-switch and a second clocked forwarding-switch with strong type-one transistors in the strong type-one active-region structure and strong type-two transistors in the strong type-two active-region structure;

forming a first clocked inverter with a first group of weak type-one transistors in the weak type-one active-region structure and a first group of weak type-two transistors in the weak type-two active-region structure;

forming a first connection conductor extending in a second direction that is perpendicular to the first direction; and connecting an output of the first clocked forwarding-switch and an output of the first clocked inverter with the first connection conductor.

19. The method of claim 18, further comprising:

forming a second clocked inverter with a second group of weak type-one transistors in the weak type-one active-region structure and a second group of weak type-two transistors in the weak type-two active-region structure;

forming a second connection conductor extending in the second direction; and connecting an output of the second clocked forwarding-switch and an output of the second clocked inverter with the second connection conductor.

20. The method of claim 19, further comprising:

connecting an input of a second inverter to the output of the second clocked inverter; and connecting an output of the second inverter to an input of the second clocked inverter.

* * * * *